(12) United States Patent
Ohkawa

(10) Patent No.: US 6,645,045 B2
(45) Date of Patent: Nov. 11, 2003

(54) METHOD OF MEASURING THICKNESS OF A SEMICONDUCTOR LAYER AND METHOD OF MANUFACTURING A SEMICONDUCTOR SUBSTRATE

(75) Inventor: Makoto Ohkawa, Kariya (JP)

(73) Assignee: Denso Corporation, Kariya (JP)

( * ) Notice: Subject to any disclaimer, the term of this patent is extended or adjusted under 35 U.S.C. 154(b) by 44 days.

(21) Appl. No.: 10/093,894

(22) Filed: Mar. 11, 2002

(65) Prior Publication Data

US 2002/0173084 A1 Nov. 21, 2002

(30) Foreign Application Priority Data

Mar. 12, 2001 (JP) .......................... 2001-069184
Jul. 16, 2001 (JP) .......................... 2001-215657

(51) Int. Cl.[7] ............................................. B24B 49/00
(52) U.S. Cl. .............................. 451/6; 451/10; 451/11; 356/485; 356/504
(58) Field of Search ..................... 451/6, 8, 9, 10, 451/11, 41; 356/451, 485, 488, 503, 504, 305, 328

(56) References Cited

U.S. PATENT DOCUMENTS

| | | | |
|---|---|---|---|
| 3,744,916 A | | 7/1973 | Bey et al. |
| 5,081,796 A | | 1/1992 | Schultz |
| 5,658,418 A | * | 8/1997 | Coronel et al. ............. 156/345 |
| 5,893,796 A | | 4/1999 | Birang et al. |
| 5,964,643 A | | 10/1999 | Birang et al. |
| 6,020,968 A | * | 2/2000 | Horie ....................... 356/382 |
| 6,045,439 A | | 4/2000 | Birang et al. |
| 6,142,855 A | | 11/2000 | Nyui et al. |
| 6,190,234 B1 | | 2/2001 | Swedek et al. |
| 6,204,922 B1 | * | 3/2001 | Chalmers .................. 356/381 |
| 6,247,998 B1 | * | 6/2001 | Wiswesser et al. ............ 451/6 |
| 6,261,152 B1 | | 7/2001 | Aiyer |
| 6,551,172 B1 | * | 4/2003 | Nyui et al. .................. 451/6 |

FOREIGN PATENT DOCUMENTS

| | | |
|---|---|---|
| JP | A-5-234971 | 9/1993 |
| JP | A-5-308096 | 11/1993 |
| JP | A-5-309558 | 11/1993 |
| JP | A-7-4921 | 1/1995 |
| JP | A-8-216016 | 8/1996 |
| JP | A-8-316179 | 11/1996 |
| JP | A-9-162087 | 6/1997 |
| JP | A-11-33901 | 2/1999 |
| JP | A-2000-354961 | 12/2000 |
| JP | A-2001-144059 | 5/2001 |
| WO | WO99/54924 | 10/1999 |

OTHER PUBLICATIONS

U.S. patent application Ser. No. 09/616,372, Komura et al., filed Jul. 13, 2000.
U.S. patent application Ser. No. 09/709,456, Ohkawa, filed Nov. 13, 2000.

* cited by examiner

*Primary Examiner*—Eileen P. Morgan
(74) *Attorney, Agent, or Firm*—Posz & Bethards, PLC

(57) ABSTRACT

The disclosed method of measuring the thickness of an active layer of an SOI substrate maintains the accuracy of previous methods but can be performed quickly and during processing of the substrate. The method includes reading data from light reflected from the substrate. A range of light wavelengths for analysis is selected, which avoids the problem of nodes, at which interference between light reflected from different surfaces is weakened. The method determines a relationship between wavelength and reflection intensity and determines peak values of the relationship. The wavelengths corresponding to an arbitrary pair of the peak values, and the number of waves between the peak values, are used to calculate the thickness of the active layer. The method includes an error correction procedure that increases measurement accuracy.

18 Claims, 16 Drawing Sheets

DETECTION BEAM $\lambda_1 = 2n(\lambda_1)d/(m-0.5)$   $\lambda_2 = 2n(\lambda_2)d/(m-X-0.5)$

METHOD OF MEASURING THICKNESS OF A SEMICONDUCTOR LAYER AND METHOD OF MANUFACTURING A SEMICONDUCTOR SUBSTRATE

CROSS REFERENCES TO RELATED APPLICATIONS

This application relates to and claims priority from Japanese Patent Application Nos. 2001-69184, filed on Mar. 12, 2001, and 2001-215657, filed on Jul. 16, 2001, the contents of which are hereby incorporated by reference.

BACKGROUND OF THE INVENTION

This invention relates to a method of manufacturing a semiconductor substrate, such as an SOI substrate, and a method of measuring film thickness of an active layer (semiconductor layer) on an SOI substrate comprising an oxide film sandwiched between two silicon substrates.

A silicon wafer is mirror-polished after going through a slicing step, lapping step, etching step, and a polishing step. The mirror-polishing step is specifically accomplished by pasting a multitude of wafers on a multitude of rotating polishing blocks with, for example, wax and pressing wafers on the surface of a rotating polishing plate to which a polishing cloth is attached.

In recent years, there has been an increased need to make sure that surfaces of silicon wafers are flat and parallel to each other. Silicon wafer thickness must be controlled closely to meet this need. When forming an SOI substrate by pasting together two silicon substrates, film thickness control during polishing becomes a critical issue for obtaining an active layer of the specified thickness.

In a conventional process for polishing an SOI substrate, steps for rough polishing are performed for a specified amount of time, film thickness of the active layer is measured by taking the SOI substrate out of a polishing system, and steps for fine polishing and film thickness measurement are repeated until the active layer attains the specified film thickness. Because the SOI substrate would become unusable with excess polishing, repeated polishing and film thickness measurement steps are needed. Taking the substrate out of the polishing system for film thickness measurement is required for each iteration. This results in many steps and more polishing time.

To address this problem, various methods of measuring the film thickness during polishing for a monitoring purpose have been explored. Out of those, the most promising technology is a method of measuring the film thickness based on optical interference (See Japanese unexamined patent publication (JP-A) No. H8-216016).

A study by the inventors, however, has revealed that that a time lag, which results from collecting the interference data for a wavelength spectrum during an optical interference process for film thickness measurement, makes it difficult to obtain an accurate film thickness measurement, because the film thickness changes during the time lag.

In addition, in an SOI substrate structure comprising two silicon substrates sandwiching an oxide film, optical interference is weakened by light beams reflecting from both sides of the oxide film, because the oxide film is sandwiched between materials of the same optical characteristics. This problem results in "nodes" with weakened optical interference at specific oxide film thicknesses. It is difficult to take measurements at wavelengths corresponding to the nodes.

FIGS. 23A and 23B show relationships between wavelength and reflectance, obtained by simulation, when film thicknesses are 5 $\mu$m for the active layer and 1 $\mu$m and 2 $\mu$m, respectively, for the oxide film. As FIG. 23A shows, an optical-interference wave pattern shows a maximum around a wavelength of 830 nm. However, when there is a node near this wavelength, the value at this wavelength becomes a minimum, as FIG. 23B shows. In other instances, the wave form might not show a peak or a maximum value. An accurate film thickness measurement is impossible when there are no peaks where they are supposed to be.

SUMMARY OF THE INVENTION

An object of this invention is to address the issues discussed above, take into account the time lag associated with the collection of interference data, and facilitate accurate film-thickness measurements. Another objective of this invention is to make accurate film-thickness measurement possible by taking into account the nodes at which optical interference is weakened.

The invention is basically a method of measuring the film thickness of an active layer on an SOI substrate. The SOI substrate includes the active layer, which is a semiconductor layer, and a supporting substrate. The active layer and the supporting substrate sandwich an oxide film. The method includes radiating light on the SOI substrate. A range of analysis wavelengths is selected to eliminate wavelengths at which optical interference is weakened by light beams reflected from both surfaces of the oxide film. The method includes breaking down light that is reflected from the SOI substrate into a spectrum by wavelength. Complete optical interference data is collected by wavelength of the reflected light. Finally, the film thickness of the active layer is calculated based on the interference data in the selected wavelength range.

In another aspect of the invention, the range of analysis wavelengths includes wavelengths $\lambda$ that satisfy the following inequality:

$$\frac{2 \cdot n_{ox} \cdot d_{ox}}{m - 0.98} > \lambda > \frac{2 \cdot n_{ox} \cdot d_{ox}}{m - 0.02}$$

where $n_{ox}$ is an refractive index for the oxide film, $d_{ox}$ is the thickness of the oxide film, and m is an arbitrary positive integer.

In another aspect of the invention the film thickness d of the active layer is calculated with the following equation:

$$d = \frac{\lambda_1 \cdot \lambda_2}{\lambda_2 \cdot n(\lambda_1) - \lambda_1 \cdot n(\lambda_2)} \cdot \frac{(X + s_1 - s_2)}{2}$$

where $\lambda_1$ and $\lambda_2$ are wavelengths corresponding to different peak values, respectively, $n(\lambda_1)$ is the film's refractive index at wavelength $\lambda_1$, $n(\lambda_2)$ is the film's refractive index at wavelength $\lambda_2$, X is the wave number between the two wavelengths, and $s_1$ and $s_2$ are phase shift amounts between a single layer film structure and a double layer film structure at the wavelengths corresponding to the peak values.

Other features, objects and advantages of the invention will become apparent from the following description of preferred embodiments made in reference to the accompanying drawings, which form a part of the specification.

DETAILED DESCRIPTION OF THE PREFERRED EMBODIMENTS

First Embodiment

A method of measuring film thickness of a semiconductor layer will be described with reference to FIG. 1.

Figure 1:
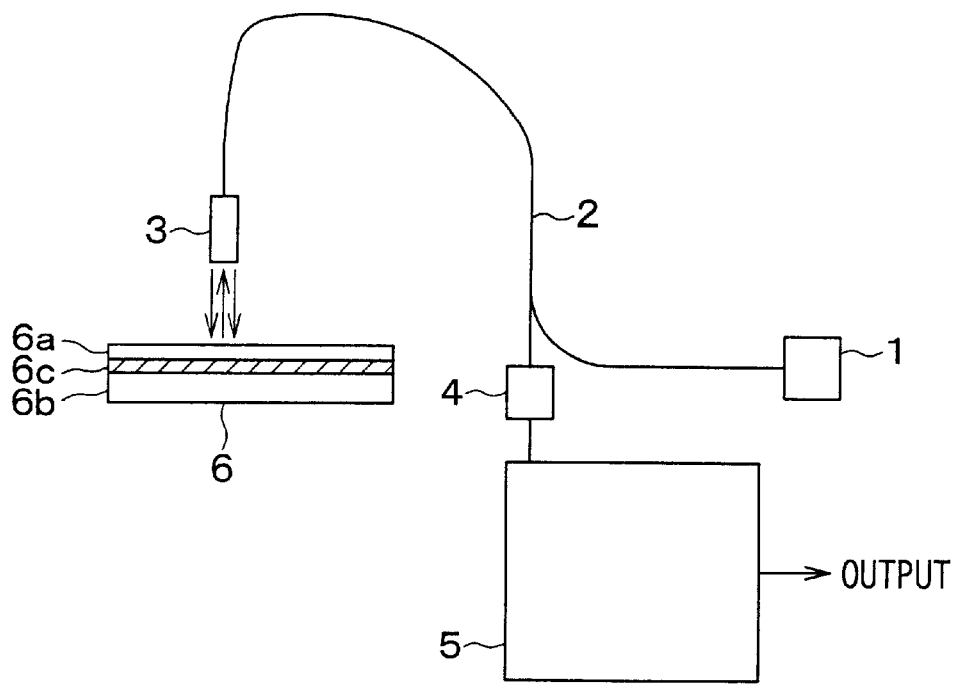
FIG. 1 is a diagram of a film thickness measurement apparatus used in performing the film thickness measurement method of the first embodiment of this invention.

As FIG. 1 shows, the film thickness measurement apparatus includes a light source 1, optical fiber carrier 2, measurement head 3, spectrometer 4, and analysis apparatus 5. The light source 1, for example, includes a tungsten halogen lamp that generates white light. The light source 1 may also supply the white part of the light spectrum from a filtered tungsten halogen lamp, a xenon lamp, or a white light bulb. The optical fiber carrier 2 may be a single fiber or a multitude of fibers for transmitting light. The optical fiber carrier 2 allows light from the light source 1 to travel to the measurement head 3 and from the measurement head 3 to a spectrometer 4.

The measurement head 3 radiates light transmitted from the optical fiber carrier 2 onto the surface of an active layer 6a of an SOI substrate 6 and captures reflected light from the SOI substrate 6. The reflected light from the SOI substrate 6, captured by the measurement head 3, is transmitted to the spectrometer 4 through the optical fiber carrier 2.

Figure 2:
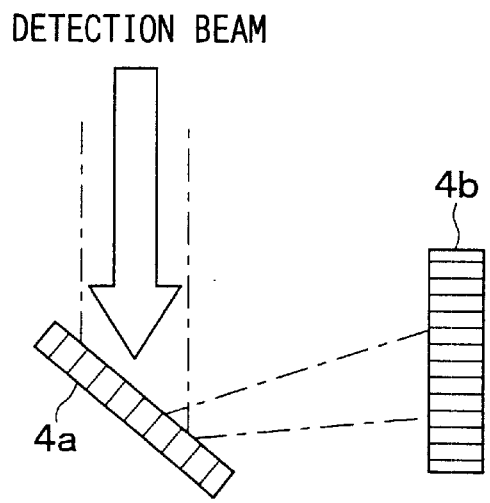
FIG. 2 is a diagram of a spectrometer.

The spectrometer 4 breaks the incoming light into its components and is able to capture complete optical interference data. FIG. 2 shows an example of the spectrometer 4. As this figure shows, the spectrometer 4 has a diffraction grating (or blazed grating) 4a and a CCD array 4b. Reflected light from the SOI substrate 6 that comes in through the optical fiber carrier 2 is broken down into its spectrum by the diffraction grating (or blazed grating) 4a, and the CCD array 4b captures the complete optical interference data by wavelength. For this reason, optical interference data is captured without a time lag by wavelength. The CCD array 4b forms a means of collecting complete interference data.

The analysis apparatus 5 analyzes the film thickness of the active layer 6a on the surface of the SOI substrate 6 based on the interference data captured by the CCD array 4*b*, after the light is broken down into a spectrum by the spectrometer 4. At the same time, the analysis apparatus 5 provides output corresponding to the film thickness analysis results. This output is used for, for example, monitoring the film thickness analysis results on a display device to facilitate further film thickness adjustments based on the film thickness analysis results and for end-point detection for the polishing process of the active layer 6*a*.

Figure 3:
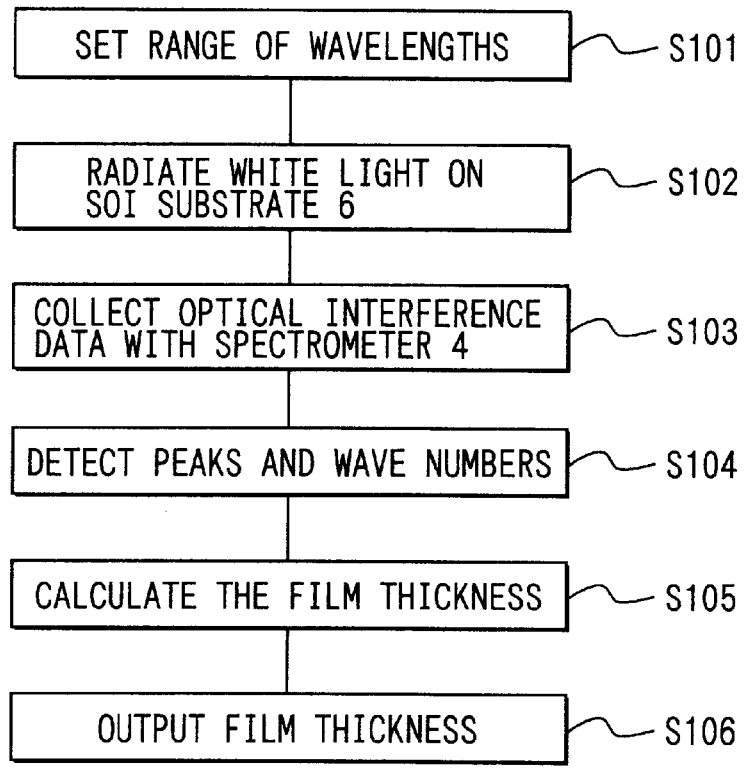
FIG. 3 is a flowchart for film thickness measurement using the film thickness measurement apparatus shown in FIG. 1.

FIG. 3 shows a flowchart for the film thickness measurement using the film thickness measurement system in FIG. 1. Details of the film thickness measurement process will be discussed using this figure. Firstly, a range of analysis wavelengths is specified (Step S101). This range of analysis wavelengths refers to the range of wavelengths in the complete interference data, captured by the CCD array 4*b*, that will be used for film thickness measurements. Details will follow on how this range of analysis wavelengths is specified.

Next, the light source 1 is turned on to radiate the surface of the active layer 6*a* of the SOI substrate 6 through the optical fiber carrier 2 and measurement head 3 (Step S102), and reflected light from the SOI substrate 6 is transferred through the measurement head 3 and optical fiber carrier 2 to the spectrometer 4 to capture the interference data by wavelength with the spectrometer 4 (Step S103). As a result, interference data by wavelength is obtained without time lag. The analysis apparatus 5 obtains a wave form for the reflected light based on the interference data by wavelength and a relationship between wavelength and reflection intensity. A graph showing this relationship shows a periodicity in the reflection intensity with respect to wavelength. Based on the relationship between wavelength and reflection intensity, peak values (maximum values and minimum values) in the wave form for the reflected light and wave numbers within the range of analysis wavelengths, which was specified earlier, are obtained (Step S104). Based on the peak values and wave numbers, the analysis apparatus 5 calculates the film thickness (Step S105) and provides an output corresponding to these film thickness analysis results (Step S106).

A method of analyzing the film thickness and a method used for specifying the range of analysis wavelengths will be explained next. The method of film thickness analysis will be explained using the diagram in FIG. 4.

Figure 4:
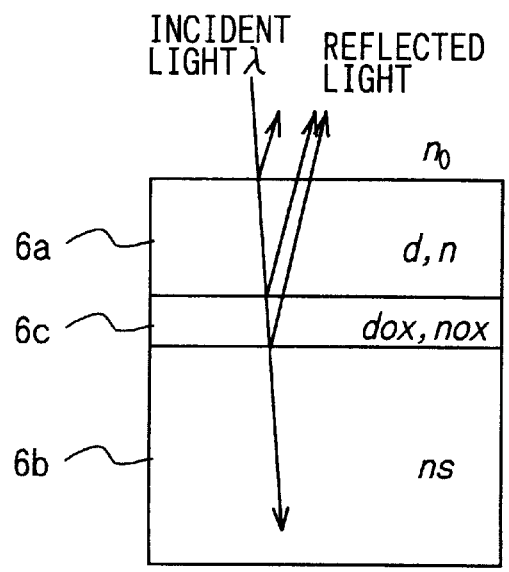
FIG. 4 a reference diagram of an SOI substrate for illustrating the method of film thickness analysis.

FIG. 4 shows a relationship between the incoming light and reflected light when light is radiated on the SOI substrate 6. As this figure shows, the SOI substrate 6 includes the active layer 6*a* and the support substrate 6*b*, which sandwich the oxide film 6*c*. An interface between the active layer 6*a* and oxide film 6*c* and an interface between the oxide film 6*c* and the support substrate 6*b* reflect the incoming light. The reflected beams optically interfere with each other. The optical interference is dependent on the film thickness d, the refractive index n of the active layer 6*a*, and the wavelength λ of the incoming light.

The following equations show the reflectance peak values, when the refractive index of the atmosphere is $n_o$, the film thickness of the oxide film 6*c* is represented by $d_{ox}$, the refractive index of the oxide film 6*c* is represented by $n_{ox}$, and the refractive index of the supporting substrate 6*b* is represented by $n_s$. It is possible to determine which of the equations corresponds to the maximum values and minimum values of the reflectance peaks, based on the relative sizes of the refractive indices n, $n_{ox}$, and $n_s$ of the films 6*a* through 6*c*, respectively. The symbol m represents a natural number in these equations.

$$2 \cdot n \cdot d = m \cdot \lambda \qquad \text{Equation A}$$

$$2 \cdot n \cdot d = \left(m - \frac{1}{2}\right)\lambda \qquad \text{Equation B}$$

Equation A shows the minimum values and Equation B shows the maximum values when $n_o$>n and n>$n_s$. Equation A shows the maximum values and Equation B shows the minimum values when $n_o$>n and n<$n_s$. Equation A shows the maximum values and Equation B shows the minimum values when $n_o$<n and n>$n_s$. Equation B shows the maximum values and Equation A shows the minimum values when $n_o$<n and n<$n_s$.

Because positions at which the reflectance shows peak values and positions at which the wave form for the reflected light shows peak values, as obtained in Step S104, match, the film thickness d of the active layer 6*a* can be obtained by the following equation and the relationships in Equations A and B.

$$d = \frac{\lambda_1 \cdot \lambda_2}{\lambda_2 \cdot n(\lambda_1) - \lambda_1 \cdot n(\lambda_2)} \cdot \frac{X}{2} \qquad \text{Equation C}$$

The symbols $\lambda_1$ and $\lambda_2$ represent the wavelengths corresponding to arbitrary peak values, $n(\lambda_1)$ is the film's refractive index at wavelength $\lambda_1$, $n(\lambda_2)$ is the film's refractive index at wavelength $\lambda_2$, and X is the wave number between the two wavelengths. The wavelength corresponding to each peak value can either correspond to a maximum value or a minimum value. In other words, any combination of a pair of maximum values, a pair of minimum values, or a pair consisting of a maximum value and a minimum value may be used. When a pair that is a combination of a maximum value and a minimum value is used, X would not be a natural number but would be +/− 0.5 added to a natural number.

Figure 5:
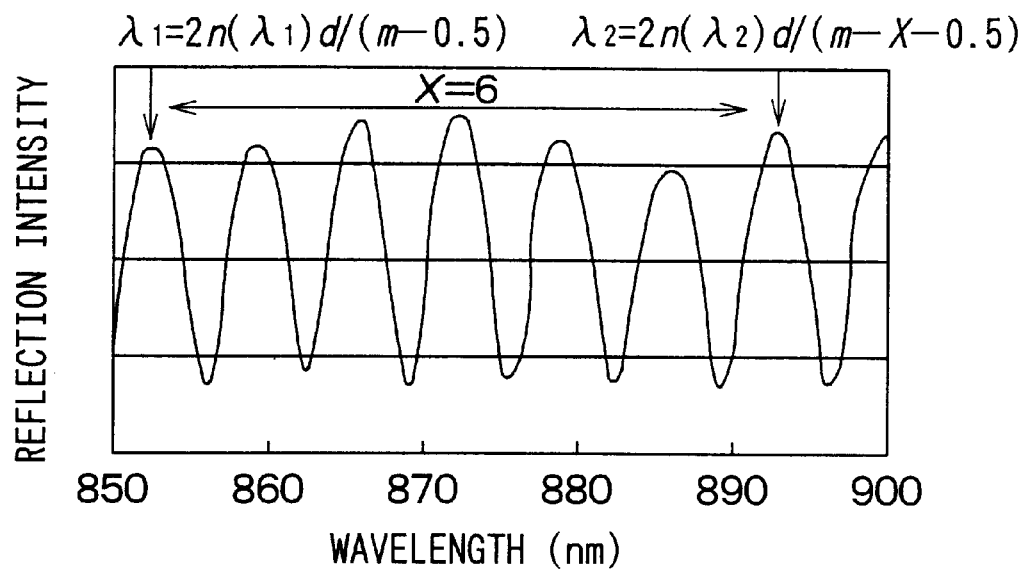
FIG. 5 is a wave form graph that shows a relationship between wavelength and reflection intensity.

As a reference, FIG. 5 shows the relationship between wavelength and reflection intensity when the active layer 6*a* is 14 μm thick and the oxide film 6*c* is 1.3 μm thick. As this figure shows, when $\lambda_1$ is the wavelength corresponding to the peak value for the shortest wavelength, $\lambda_2$ is the wavelength corresponding to the peak value with X=6.

This section will discuss the range of analysis wavelengths. In the step for specifying the range of analysis wavelengths, wavelengths excluding the nodes, which were discussed earlier, are used for the analysis. First, the origin of the nodes and the effects of nodes on film thickness measurement results will be discussed.

Figure 6:
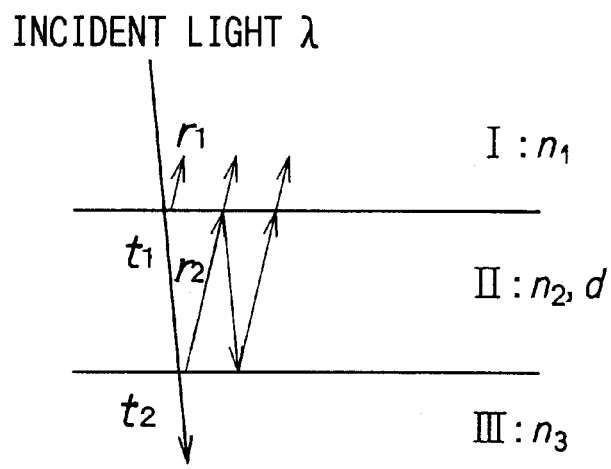
FIG. 6 is a diagram that illustrates the optical interference phenomenon.

FIG. 6 shows a diagram of the optical interference phenomenon. The origin of the nodes will be discussed using this figure. The amplitude of the reflected light $r_1$ and the amplitude of the transmitted light $t_1$ can be expressed with the following equations, which are based on Fresnel's equation, where the active layer 6*a*, oxide film 6*c*, and supporting substrate 6*b* are the media I, II, and III, respectively, the refractive index of each medium is $n_1$, $n_2$, and $n_3$, respectively, and the amplitude of the incoming light is 1.

$$r_1 = \frac{n_2 - n_1}{n_2 + n_1} \qquad \text{Equation D}$$

$$t_1 = \sqrt{(1 - r_1 \cdot \bar{r}_1)} \quad \text{Equation E}$$

In addition, the reflected light amplitude $r_2$ and transmitted light amplitude $t_2$ at an interface between the media II and III can be expressed similarly by the following equations.

$$r_2 = \frac{n_3 - n_2}{n_3 + n_2} \quad \text{Equation F}$$

$$t_2 = \sqrt{(1 - r_2 \cdot \bar{r}_2)} \quad \text{Equation G}$$

Because of the multitudes of reflections at the upper and lower interfaces of the medium II, the reflected light amplitude $r$ of the light coming into the medium I and its energy reflectance R can be expressed by the following equations.

$$r = \frac{r_1 + r_2 e^{-\frac{i\delta}{2}}}{1 + r_1 r_2 e^{-i\delta}} \quad \text{Equation H}$$

$$R = r \cdot \bar{r} = \frac{r_1^2 \cdot r_2^2 + 2r_1 r_2 \cos\delta}{1 + r_1^2 \cdot r_2^2 + 2r_1 r_2 \cos\delta} \quad \text{Equation I}$$

Therefore, $\delta = 4 \cdot \pi \cdot n_2 \cdot d/\lambda$. When medium I is the active layer 6a (Si), medium II is the oxide film 6c (SiO2) and medium III is the supporting substrate 6b (Si), or when the media I, II, and III are silicon, SiO2, and silicon, respectively, $n_1 = n_3$, and Equation J results. A combination of Equation J and Equation H will result in Equation K.

$$r_2 = \frac{n_1 - n_2}{n_1 + n_2} = -r_1 \quad \text{Equation J}$$

$$R = r \cdot \bar{r} = \frac{2r_1^2(1 - \cos\delta)}{1 + 2r_1^2(1 - \cos\delta)} \quad \text{Equation K}$$

Figure 7:
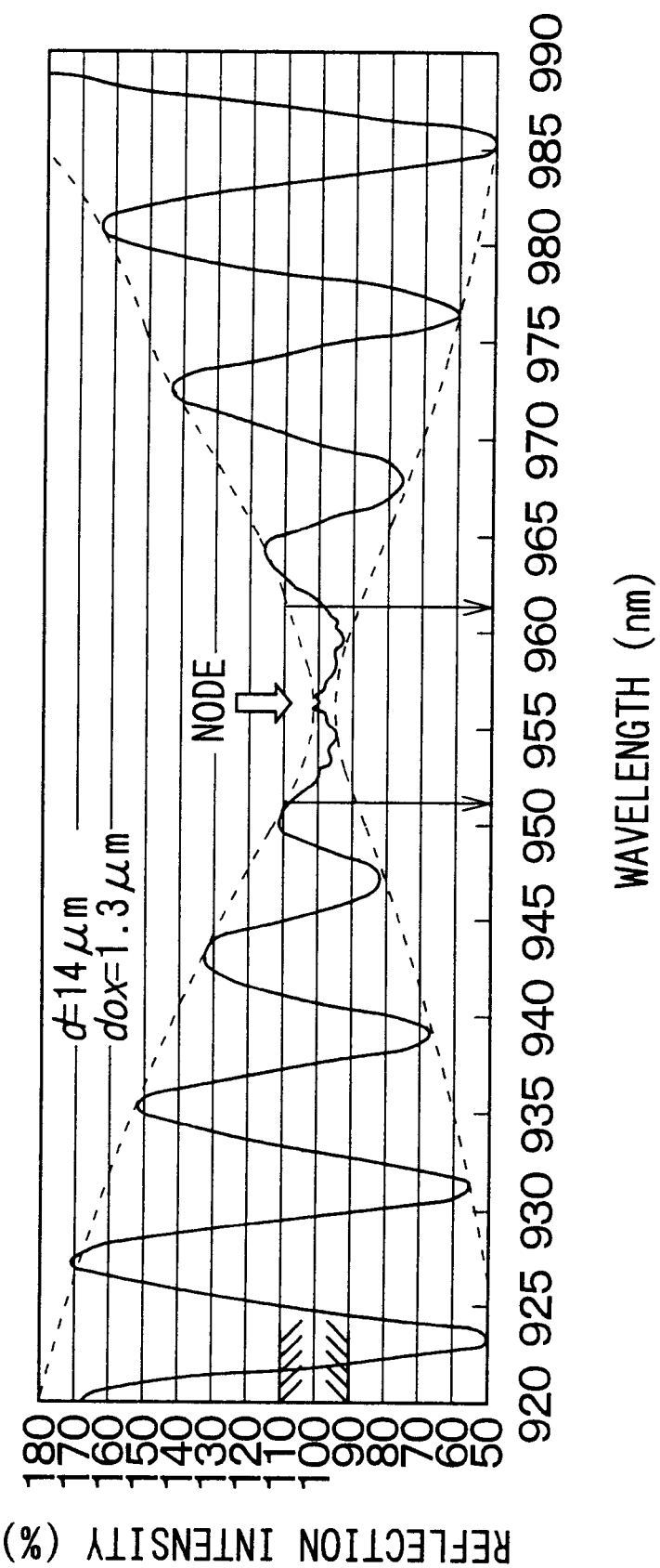
FIG. 7 is a reflection wave form graph showing a relationship between wavelength and reflection intensity for an SOI substrate in which the thickness of the active layer is 14 $\mu$m and the thickness of the oxide film is 1.3 $\mu$m.

Because $\cos\delta$ modulates between −1 and 1, R achieves the minimum value, zero, when $\cos\delta = 1$. In other words, there is, in effect, no reflection at the interface of the oxide film 6c. This means that nodes are observed when $4 \cdot \pi \cdot n_2 \cdot d/\lambda = 2 \cdot h \cdot \pi$, where h is a natural number. The range of analysis wavelengths should be set to avoid these nodes. FIG. 7 shows how this range of analysis wavelengths should be set.

FIG. 7 shows a relationship between wavelength and reflection intensity when the active layer 6a is 14 μm thick and the oxide film 6c is 1.3 μm thick. In this figure, nodes are observed near the wavelength of 957 nm, and the maximum value and minimum value that should appear near this wavelength are not there.

Peak value detection would be difficult if the measurement range were to include this node, and an accurate film thickness measurement would be impossible. In order to accurately identify the maximum value and minimum value, a modulation of +/−10% or more would be desirable. Thus, the range of analysis wavelengths should exclude the wavelengths that are within +/− 5 nm of the center wavelength of the node in the measurement results of FIG. 7. Because the wavelength dependent modulation (changes in reflectance), arising from the thickness of active layer 6a, changes with wavelength and thickness of the oxide layer 6c, the wavelength +/−5 nm, that represents the node in the measurement results in FIG. 7 can be expressed with the following equation.

$$\lambda = \frac{2 \cdot n_{ox} d_{ox}}{m \pm 0.02} \quad \text{Equation L}$$

When using an SOI substrate 6, as in this embodiment, the refractive index $n_{ox}$ and film thickness $d_{ox}$ are known in advance, and their values can be entered in advance to identify the node using Equation L. With the analysis results in FIG. 7, the refractive index $n_{ox}$, film thickness $d_{ox}$, and natural number m are 1.4, 1.32 μm and 4, respectively, for the oxide film 6c in Equation L. Therefore, the range of analysis wavelengths should be chosen using the following inequality:

$$\frac{2 \cdot n_{ox} \cdot d_{ox}}{m - 0.98} > \lambda > \frac{2 \cdot n_{ox} d_{ox}}{m - 0.02} \quad \text{Equation M}$$

Figure 8:
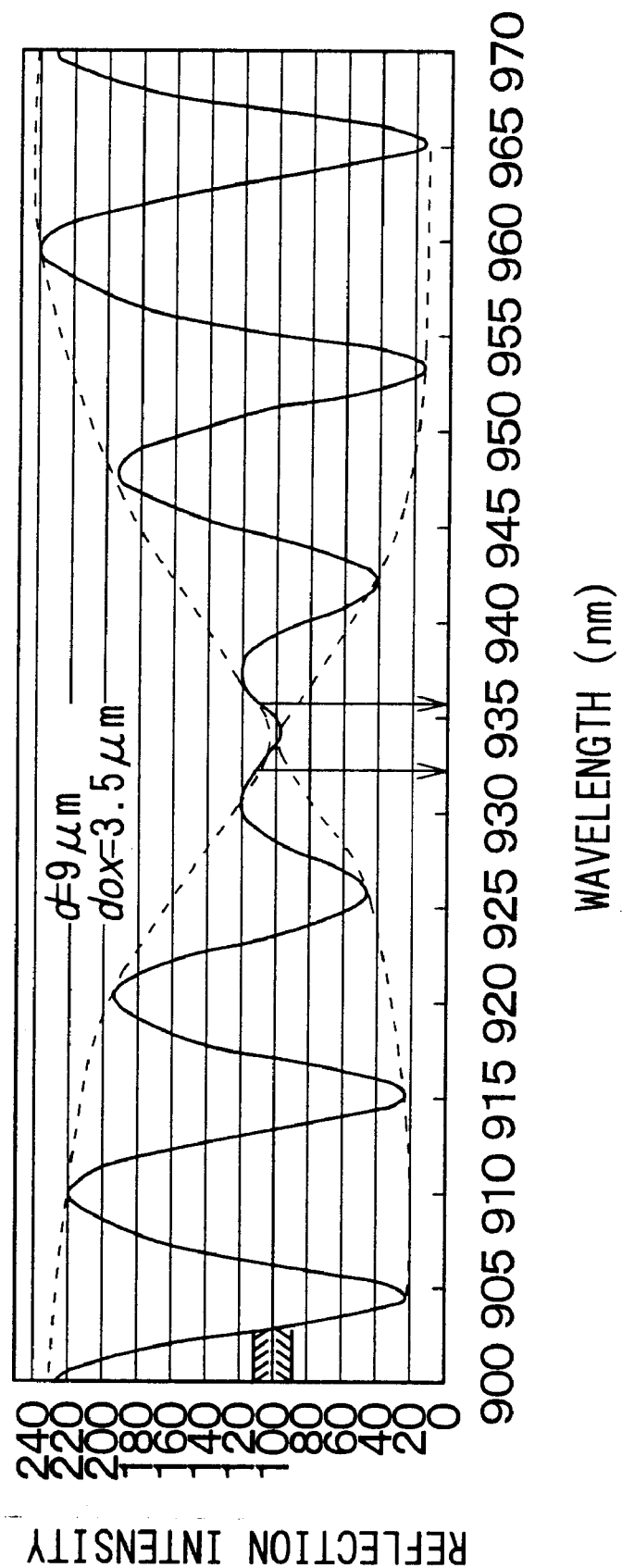
FIG. 8 is a reflection wave form graph showing a relationship between wavelength and reflection intensity for an SOI substrate in which the thickness of the active layer is 9 $\mu$m and the thickness of the oxide film is 3.5 $\mu$m.

FIG. 8 shows the analysis results for a 9 μm thick active layer 6a and 3.54 μm thick oxide film 6c. As this figure shows, modulation increases rapidly for wavelengths that are further away from the center wavelength corresponding to the node. To ensure a modulation of more than +/−10%, it is best to choose the range of analysis wavelengths outside of a range that spans +/−2 nm from the wavelength corresponding to the node. The thicker the oxide film 6c, the larger the range of wavelengths that should be eliminated from the range of analysis wavelengths, showing that the range derived from Equation M above is appropriate.

Using the method explained so far, a film thickness measurement was taken on a sample with a 3 μm thick active layer 6a and 1.2 μm thick oxide film 6c on an SOI substrate 6, with the CCD array 4b exposure time set at 10 ms, the measurement wavelength pitch set at 0.3 nm, and the spectrometer 4 resolution (half-value width) set at 1 nm.

Figure 9:
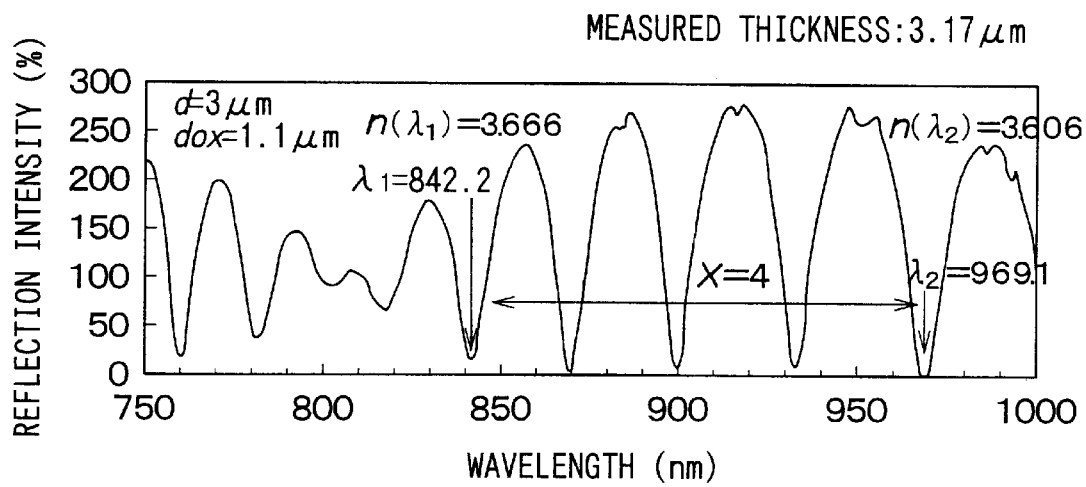
FIG. 9 is a reflection wave form graph showing a relationship between wavelength and reflection intensity for an SOI substrate in which the thickness of the active layer is 3 $\mu$m and the thickness of the oxide film is 1.1 $\mu$m.
Figure 10:
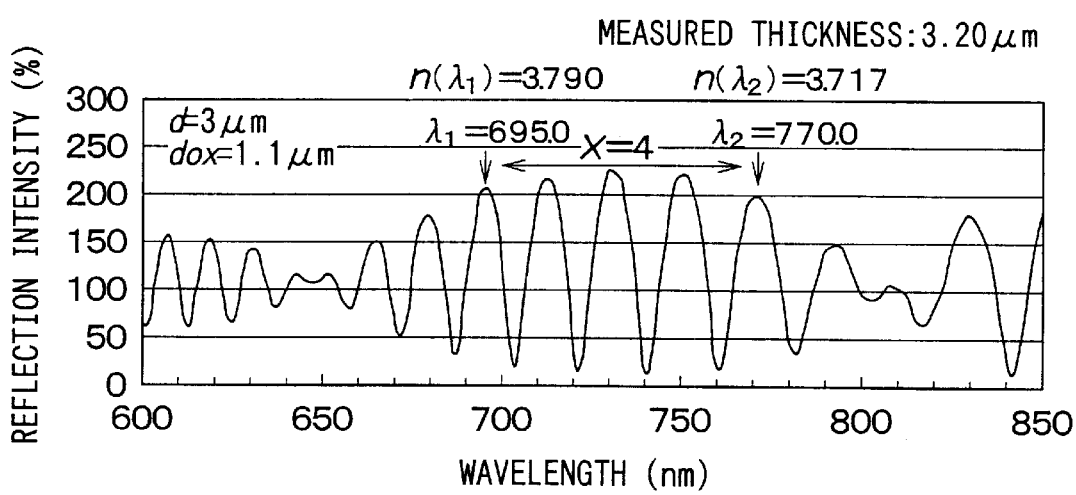
FIG. 10 is a reflection wave form graph showing a relationship between wavelength and reflection intensity for an SOI substrate in which the thickness of the active layer is 3 $\mu$m and the thickness of the oxide film is 1.1 $\mu$m.

The ranges of analysis wavelengths obtained from the Equation M for such a sample is 647 to 802 nm or 810 to 1068 nm. FIG. 9 and FIG. 10 show relationships between the wavelength of reflected light and the reflection intensity and ranges of analysis wavelengths for the above-mentioned sample. FIG. 9 shows the relationship when the minimum values are used as the peak values for thickness measurement, and FIG. 10 shows the relationships when the maximum values are used as the peak values for film thickness measurements.

As these figures show, wave numbers and peak values corresponding to the maximum value and minimum value can be measured accurately within the ranges of analysis wavelengths that have been set for avoiding the nodes. Accurately measured wave numbers and peak values make it possible to accurately measure the film thickness of the active layer 6a. Specifically, the film thickness measured for the active layer 6a was 3.17 μm in FIG. 9 and 3.20 μm in FIG. 10. The film thickness measurements corresponding to both figures were accurate.

As discussed so far, this embodiment of the invention makes it possible to collect complete interference data by wavelength and accurately measure the film thickness of the active layer 6a based on accurate wave numbers and peak values, because the ranges of analysis wavelengths have been set to avoid the nodes.

Figure 11:
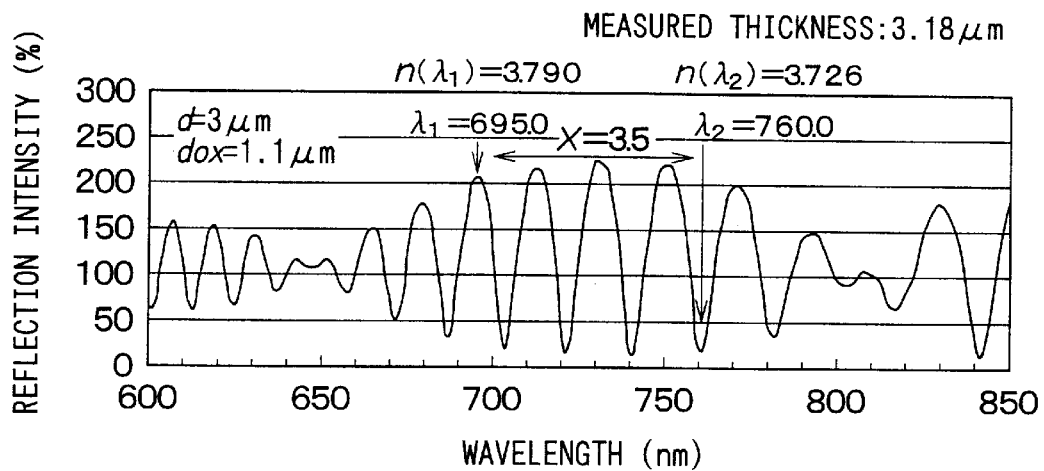
FIG. 11 is a reflection wave form graph showing a relationship between wavelength and reflection intensity for an SOI substrate in which the thickness of the active layer is 3 $\mu$m and the thickness of the oxide film is 1.1 $\mu$m.

While FIG. 9 shows peak values corresponding to minimum values and FIG. 10 shows maximum values for film thickness measurement, FIG. 11 shows a combination of maximum values and minimum values. As this figure shows, it is possible to obtain accurate wave numbers and peak values using a combination of maximum values and minimum values to accurately measure the film thickness of the active layer 6a. In this instance, the film thickness measurement result shows a film thickness of 3.18 μm, which is, again, accurate.

As shown in the previous paragraph, it does not matter whether the peak values used for film thickness measurements correspond to the maximum values or minimum values. However, because the minimum values show a sharper wave form compared with the maximum values, use of the minimum values is preferred. This has to do with accurate detection of the positions of the maximum values and minimum values. In other words, when the active layer 6a is very thin, changes in reflectance with respect to wavelength are more gradual near the maximum values. Thus, noise makes it difficult to detect the wavelength corresponding to a peak value. It may be possible to address this problem by obtaining average values for the collected data for extrapolation, but data processing would be very complicated. On the other hand, changes in reflectance with respect to wavelength take place more rapidly near the minimum values, and the data are less susceptible to noise. A wavelength corresponding to a peak value may be detected more accurately. For this reason, it is better to use the minimum peak values for film thickness measurement.

Figure 12:
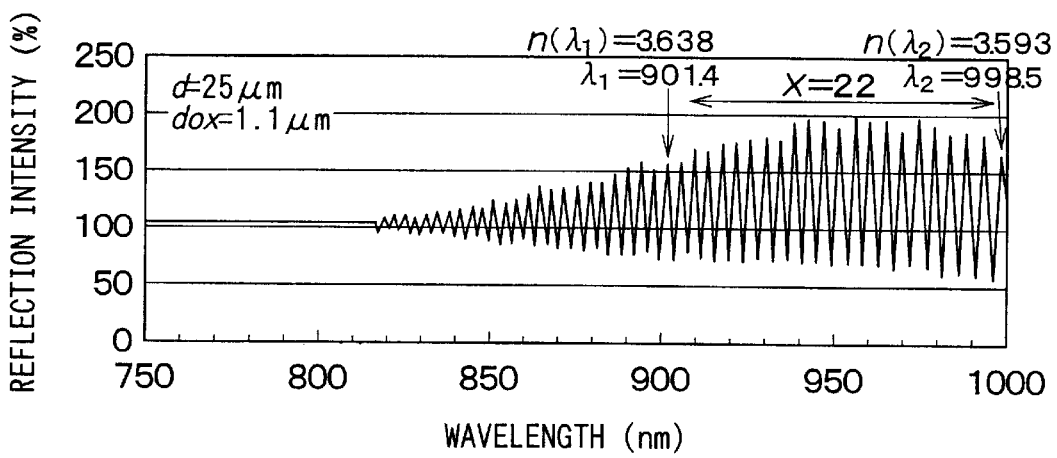
FIG. 12 is a reflection wave form graph showing a relationship between wavelength and reflection intensity for an SOI substrate in which the thickness of the active layer is 25 $\mu$m and the thickness of the oxide film is 1.1 $\mu$m.
Figure 13:
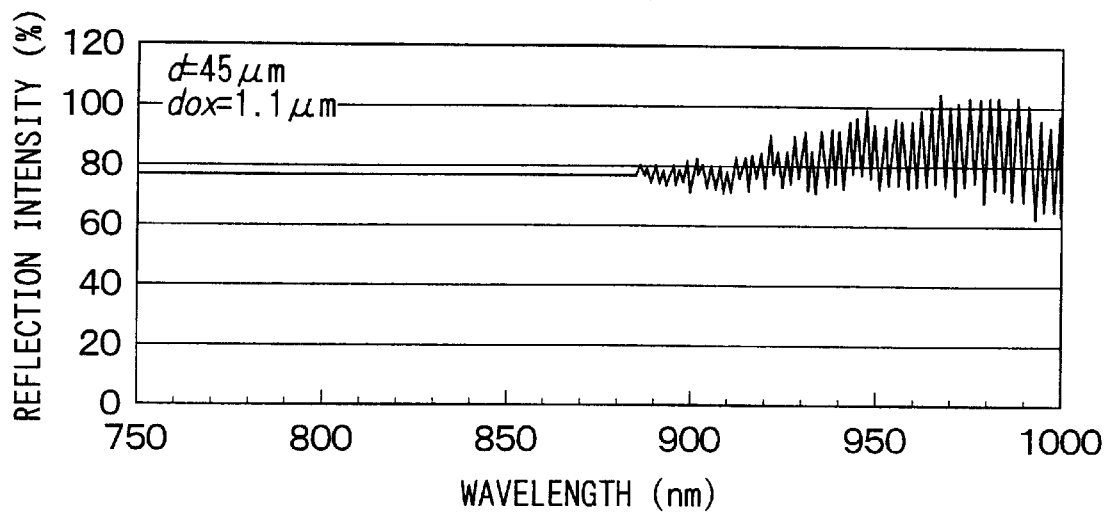
FIG. 13 is a reflection wave form graph showing a relationship between wavelength and reflection intensity for an SOI substrate in which the thickness of the active layer is 45 $\mu$m and the thickness of the oxide film is 1.1 $\mu$m.
Figure 14:
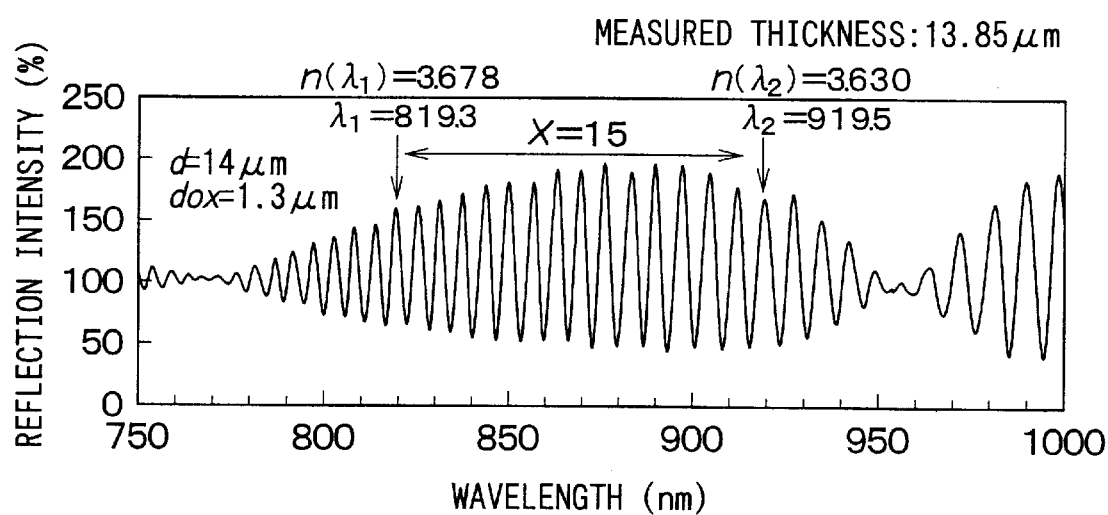
FIG. 14 is a reflection wave form graph showing a relationship between wavelength and reflection intensity for an SOI substrate in which the thickness of the active layer is 14 $\mu$m and the thickness of the oxide film is 1.3 $\mu$m.

FIGS. 12, 13 and 14 show relationships between reflection intensity and reflection wavelength when the film thickness of the active layer 6a is measured with various thickness combinations of the active layer 6a and the oxide film 6c.

In FIG. 12, the active layer 6a is relatively thick at 25 μm, and the oxide film 6c is 1.1 μm thick. Even with such a combination of film thicknesses, it is possible to obtain an accurate measurement of the film thickness of the active layer 6a by choosing a proper range of analysis wavelengths for obtaining accurate wave numbers and peak values. However, since the active layer 6a is rather thick, the active layer 6a absorbs a significant amount of light, and no peak values are captured for wavelengths shorter than 800 nm. Therefore, the ranges of analysis wavelengths must be chosen to take into account the absorption of light. For example, in FIG. 13, the active layer 6a is even thicker (45 μm) than that in FIG. 12. FIG. 13 also shows an increase in light absorption with the thicker active layer 6a.

Figure 15:
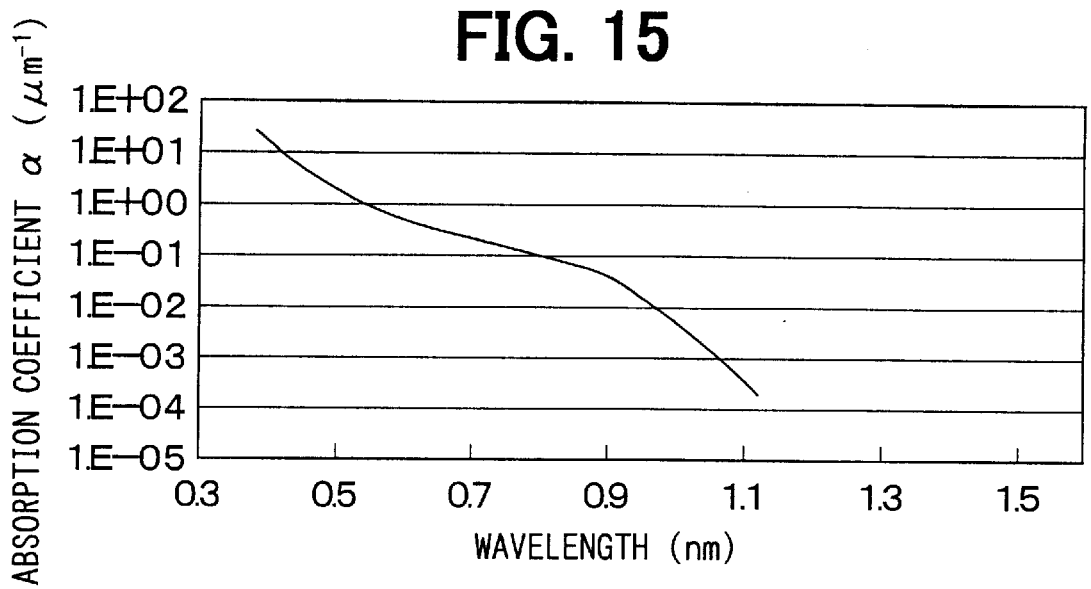
FIG. 15 is a graph showing a relationship between silicon absorption coefficient and wavelength.
Figure 16:
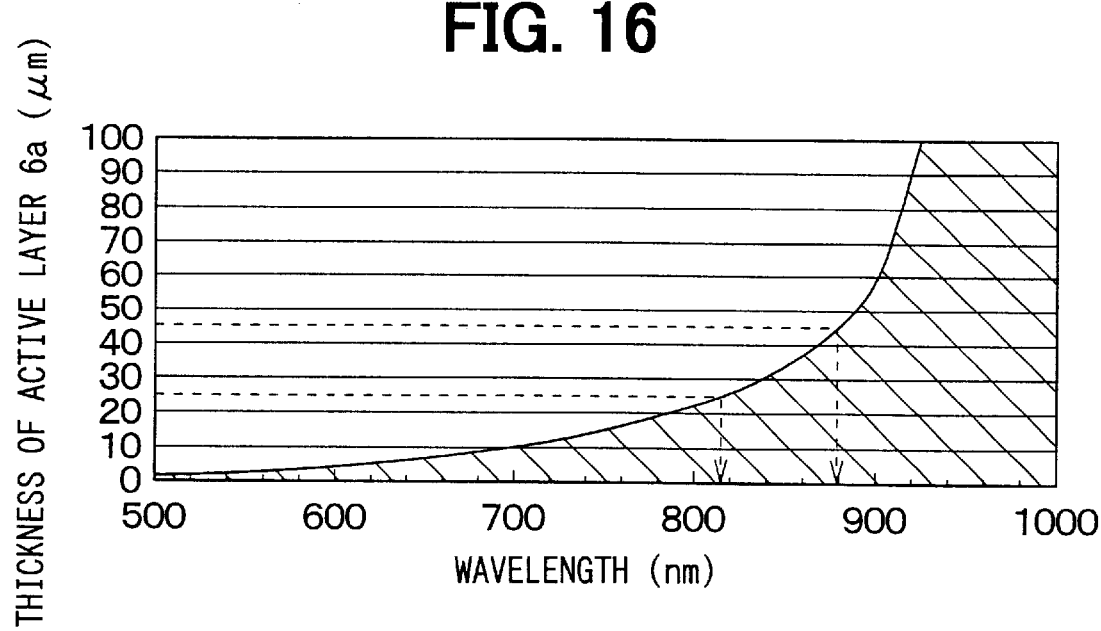
FIG. 16 is a graph showing a relationship between wavelength and film thickness of the active layer 6a that indicates the thickness at which transmittance in the active layer 6a reaches 10%.

FIG. 15 shows the wavelength dependence of the optical absorption constant α of the active layer 6a, or silicon. This figure shows that the longer the wavelength, the smaller the absorption constant α, or the higher the film transparency. A study of the relationship between the optical interference and transmittance, which was conducted based on the transmittance of the active layer 6a and which resulted in FIG. 12 and FIG. 13, shows that optical interference can be clearly captured when the transmittance is 10%. FIG. 16 shows the relationship between wavelength and thickness of the active layer 6a when the transmittance is 10%. Optical interference can be captured clearly across the shaded area in this figure. In other words, the film thickness can be measured. When the thickness of the active layer 6a is 25 μm (in FIG. 12), the optical interference is clearly captured for wavelengths of 820 nm or greater. When the thickness of the active layer 6a is 5 μm (in FIG. 13), the optical interference is captured for wavelengths of 880 nm or longer. These results match with the results in FIG. 16. These results show that optical interference can be captured accurately by choosing the ranges of wavelengths at which optical transmittance through the active layer 6a is 10% or more for accurate film thickness measurements.

On the other hand, FIG. 14 shows results for an active layer 6a that is 14 μm thick and an oxide film 6c that is 1.3 μm thick. Even in this instance, nodes are clearly observed as the figure shows. Accurate wave numbers and peak values can be obtained, because the ranges of analysis wavelengths have been chosen to avoid the nodes for an accurate film thickness measurement of the active layer 6a.

Figure 17:
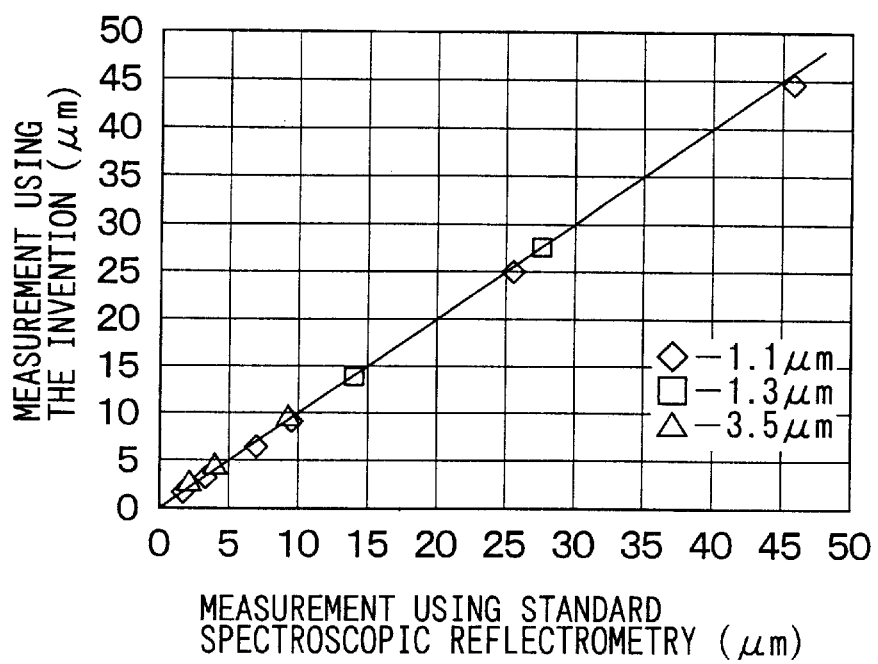
FIG. 17 is a graph showing a correlation between measurement results obtained from a standard sprectroscopic reflectometer and measurement results using the method of the first embodiment of this invention.

FIG. 17 shows a comparison between film thickness measurements obtained using regular sprectroscopic reflectometry and results obtained by the method described above. Measurement data were collected under the following measurement conditions: the CCD array 4b exposure time was 6 ms, the distance between the measurement head 3 and the SOI substrate 6 was 20 mm, and the wavelengths corresponding to the maximum values were detected. The ranges of analysis wavelengths were set to be 850 to 960 nm when the oxide film 6c was 1.1 μm (920 to 1,000 nm only when the active layer 6a was 46 μm thick); 820–920 nm when the oxide film 6c was 1.3 μm thick; and 860 to 920 nm when the oxide film 6c was 3.5 μm thick. The sprectroscopic reflectometers used for measuring the thickness of the active layer 6a were a Nanospec sprectroscopic reflectometer from Nanometrics, which was used when the film thickness was 7 μm or less, and an FT-Ir sprectroscopic reflectometer, which was used when the film thickness was 7 μm or more.

These measurement data show that data collected by the measurement technique of this invention match almost completely with the film thickness data obtained using sprectroscopic reflectometry.

Figure 18:
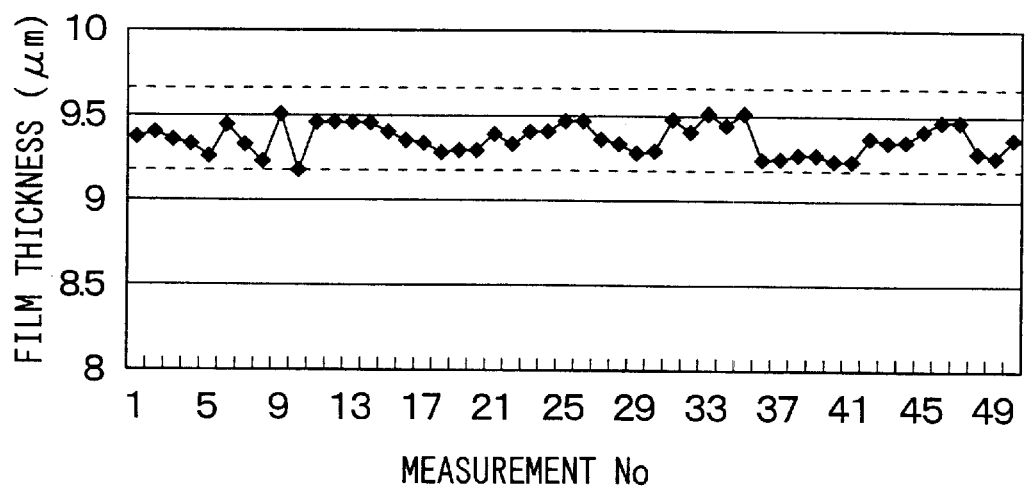
FIG. 18 is a graph of film thickness for multiple measurements taken at various rotational positions of the SOI substrate.

Using the method described above, measurements were also taken while the SOI substrate 6 was rotated. FIG. 18 shows the results. The measurement conditions for these measurements were as follows: the CCD array 4b exposure time was 10 ms, the range of analysis wavelengths was 850 to 960 nm, and the SOI substrate 6 rotated at 75 rotations per minute. The SOI substrate 6 was six inches in diameter, the active layer 6a was 9.3 μm thick, and the oxide film 9c was 1.1 μm thick. The measurement pitch was 10 mm, starting from the outer perimeter of the SOI substrate 6. The measurement interval was one second. The broken lines in FIG. 18 represent the maximum value and minimum value, obtained by measuring film thickness of the active layer 6 at four points using an Ft-Ir system when the SOI substrate 6 was stationary.

As these results show, the measurement results match with those obtained using the Ft-Ir sprectroscopic reflectometer, even when the SOI substrate was rotating. Accurate film thickness measurement of the active layer 6a is possible.

Figure 19:
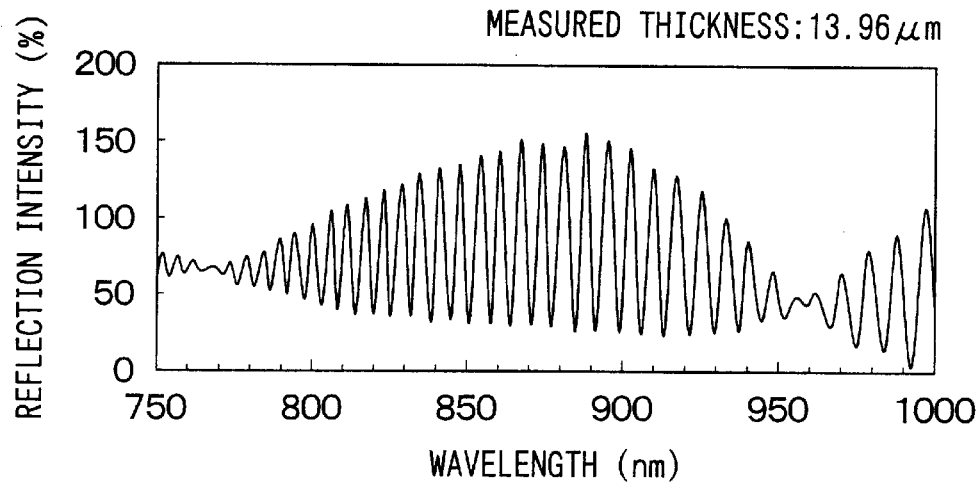
FIG. 19 is a reflection wave form graph showing a relationship between wavelength and reflection intensity when water is present for an SOI substrate in which the thickness of the active layer is 14 $\mu$m and the thickness of the oxide film is 1.3 $\mu$m.

Using the method described above, measurements have also been taken when the surface of the SOI substrate 6 (active layer 6a) was covered with water. FIG. 19 shows the results. With these measurements, the water film was 1 mm thick, the active layer 6a was 14 μm thick, and the oxide film 6c was 1.3 μm thick. Even in the presence of water, wave numbers and peak values could be accurately captured by choosing a range of analysis wavelengths that avoided the nodes in order to obtain accurate thickness of the active layer 6a.

Figure 20A:
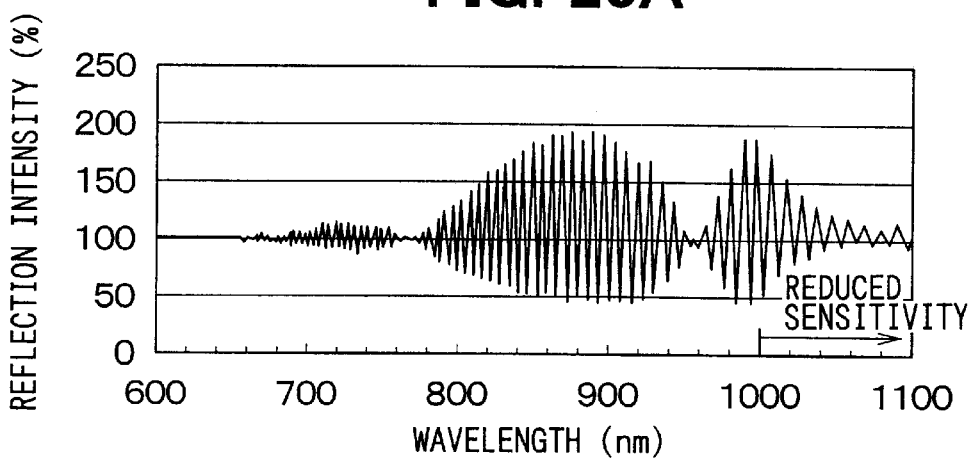
FIG. 20A is a reflection wave form graph illustrating a relationship between wavelength and reflection intensity for an SOI substrate in which the thickness of the active layer is 14 $\mu$m and the thickness of the oxide film is 1.3 $\mu$m.
Figure 20B:
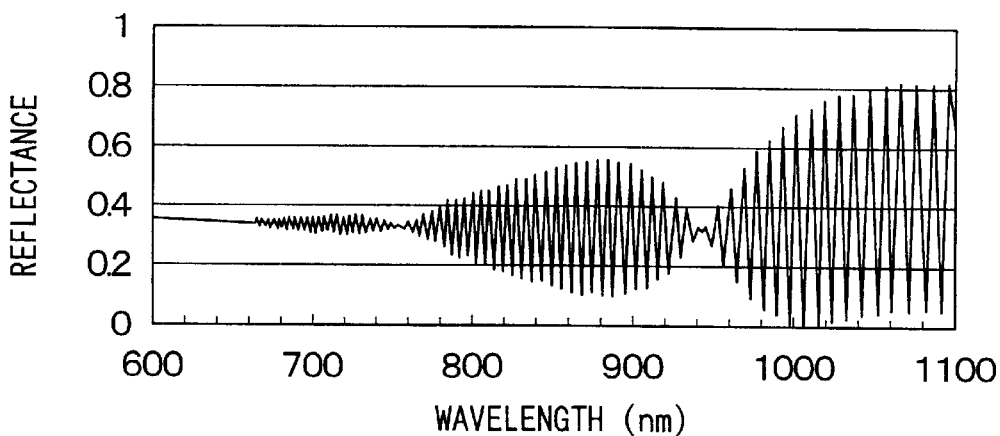
FIG. 20B is a reflection wave form graph illustrating a relationship between wavelength and reflection intensity for an SOI substrate in which the thickness of the active layer is 14 $\mu$m and the thickness of the oxide film is 1.3 $\mu$m.

So far, the method of setting the upper limit for the range of analysis wavelengths has not been discussed. The upper limit of the range of analysis wavelengths is set according to the means chosen for collecting complete interference data for the reflected light. For example, as already discussed, when the CCD array 4b is used as the means for collecting the complete interference data on the reflected light, the wave form showing a relationship between wavelength and reflection intensity would be as shown in FIG. 20A and diverge from a theoretical wave form, which is shown in FIG. 20B, at longer wavelengths. This divergence is caused by a lack of sensitivity of the CCD array 4b. The lack of sensitivity becomes an issue at wavelengths that are 1000 nm or longer for the CCD array 4b. Therefore, when using the CCD array 4b, the upper limit for the range of analysis wavelengths should be set at approximately 1000 nm.

Second Embodiment

Figure 21:
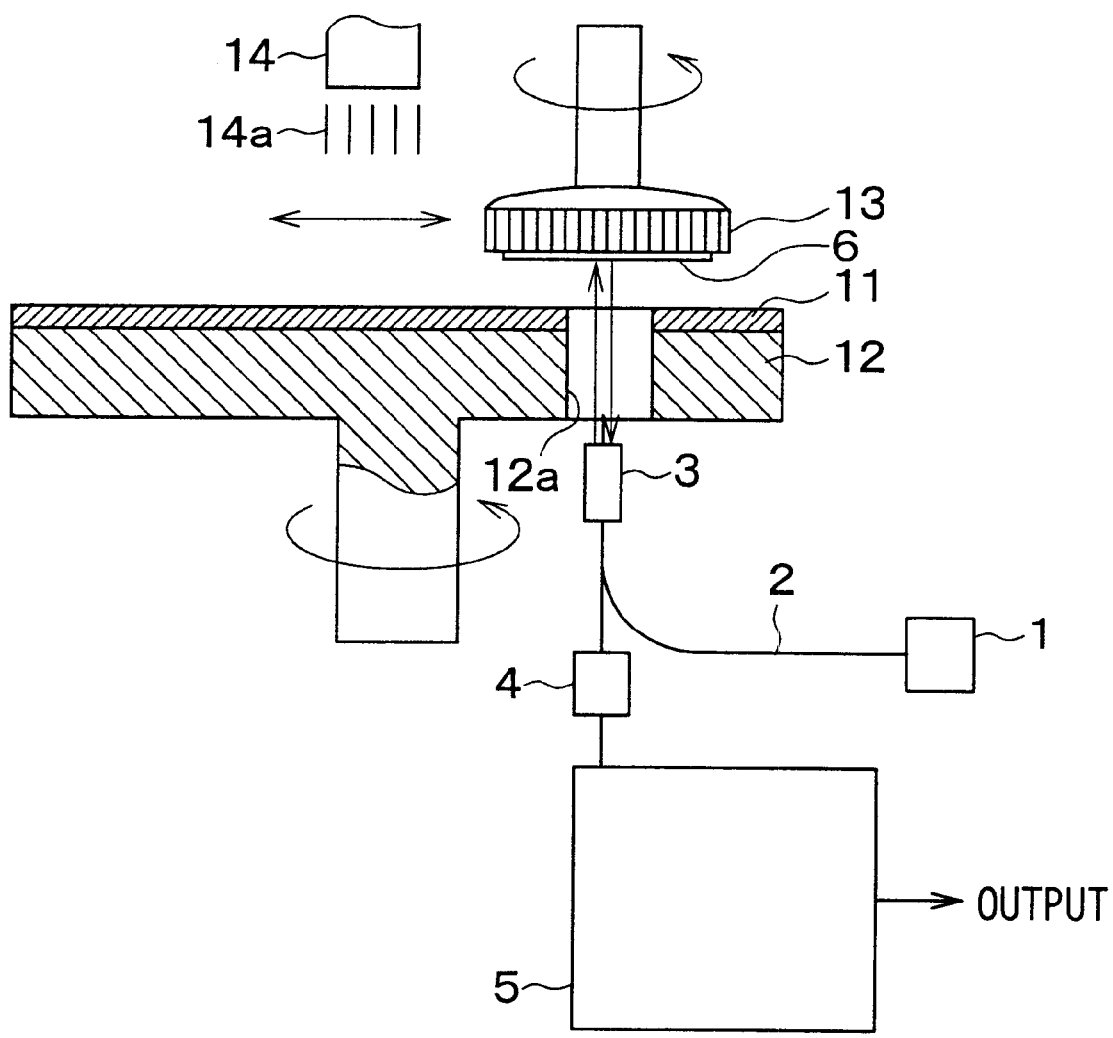
FIG. 21 is a diagram of a film thickness measurement apparatus used for a second embodiment of this invention.

In a second embodiment, the film thickness of an active layer 6a is measured using the film thickness measurement system of FIG. 1, as an SOI substrate 6 gets polished in a polishing system. FIG. 21 shows the film thickness measurement apparatus of FIG. 1 incorporated in a polishing apparatus.

The polishing apparatus in FIG. 21 is a chemical mechanical polish (CMP) system. This polishing system includes a polishing pad 11, a plate 12 pasted on the polishing pad 11, a head 13 to which the SOI substrate 6 is attached, and a slurry supply 14 for dripping a slurry 14a containing polishing particles.

After the SOI substrate 6 is affixed on the head 13, so that the surface of the SOI substrate 6 to be planarized (in other words, the active layer 6a) faces the polishing pad 11, the plate 12 and head 13 rotate as the head 13 presses the SOI substrate 6 onto the plate 12 and the slurry supply 14 supplies the slurry 14a, to planarize the surface of the SOI substrate 6 with the polishing pad 11.

There is a window 12a in the plate 12 and polishing pad 12 in the polishing apparatus. The film thickness measurement takes place through this window 12a. Since the process for measuring the film thickness is essentially the same as that described with respect to the first embodiment.

Figure 22:
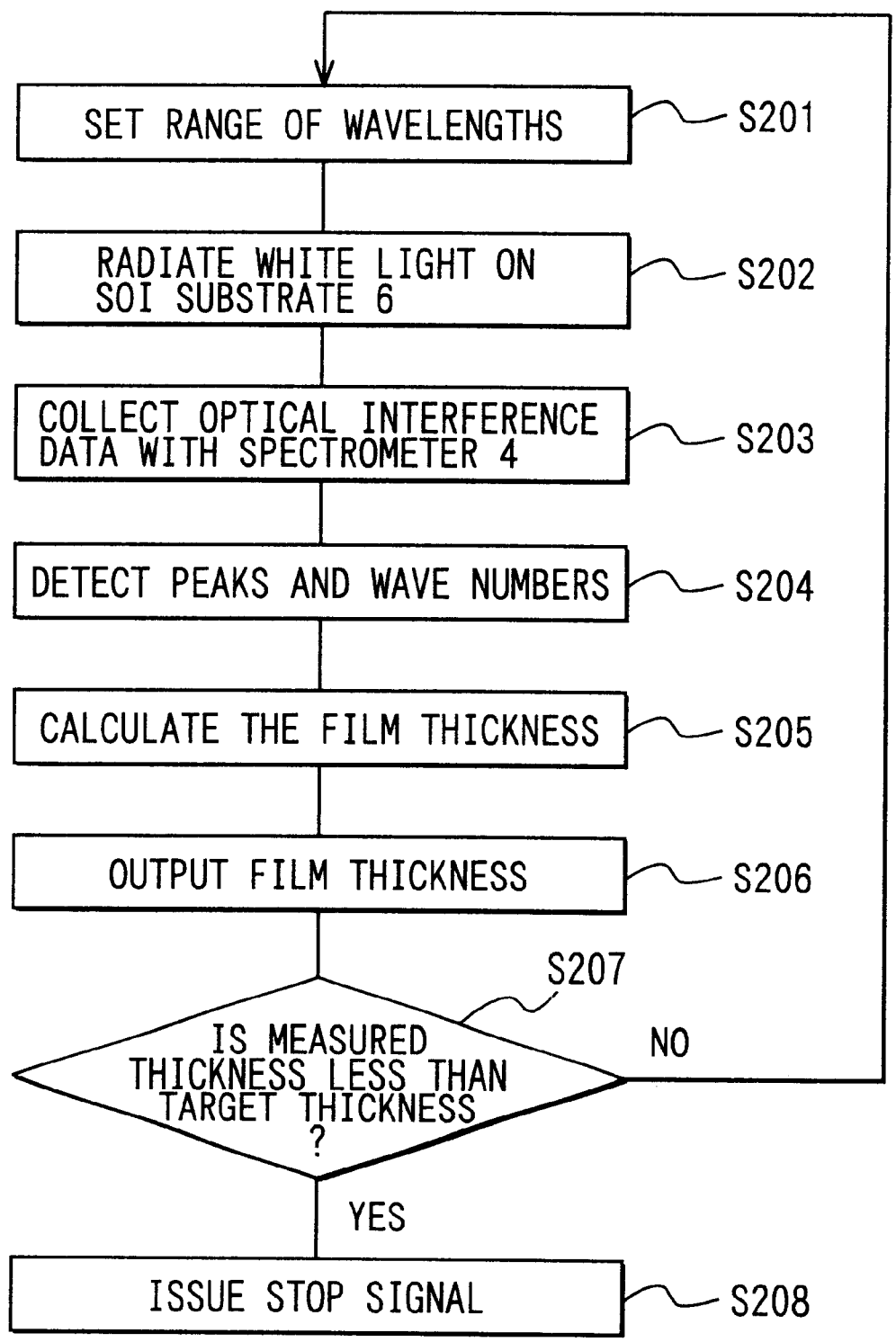
FIG. 22 is a flowchart for a film thickness measurement method using the film thickness measurement apparatus of FIG. 21.
Figure 23A:
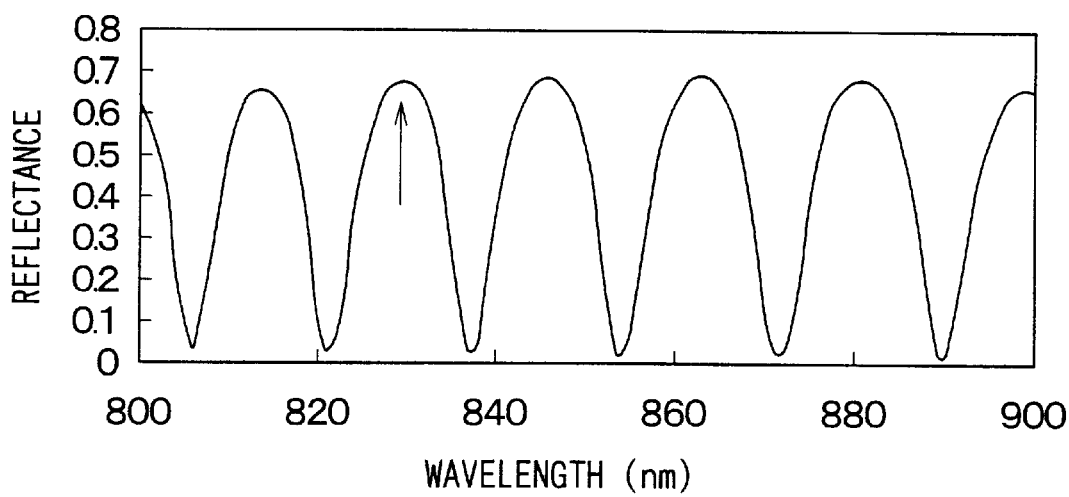
FIG. 23A is a graph of reflectance with respect to wavelength for an SOI substrate in which the thickness of the active layer is 5 $\mu$m and the thickness of the oxide film is 1 $\mu$m for explaining the effect of nodes.
Figure 23B:
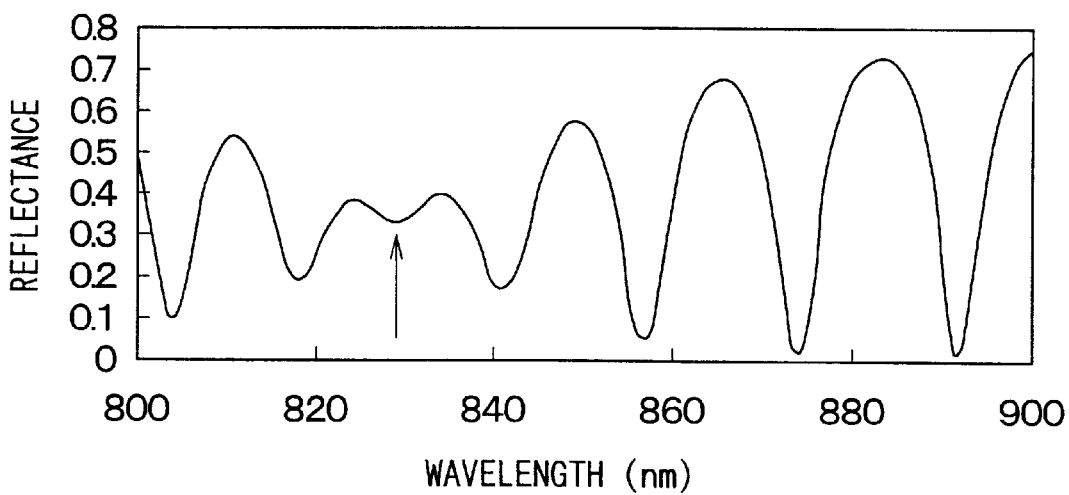
FIG. 23B is a graph of reflectance with respect to wavelength for an SOI substrate in which the thickness of the active layer is 5 $\mu$m and the thickness of the oxide film is 2 $\mu$m for explaining the effect of nodes.

The film thickness measurement takes place during polishing according to the flowchart of FIG. 22. Firstly, a range of analysis wavelengths is set, light is radiated on the SOI substrate 6, reflected light signals are measured by the spectrometer 4, peak position and wave numbers are detected, the film thickness is calculated, and an output is generated for the film thickness measurement results (Step S201 to S206). Each of these steps is similar to the steps S101 through S106 in FIG. 3. Next, a decision is made as to whether the measured film thickness is less than the target film thickness (Step S207). This step is used for determining whether the active layer 6a has attained the desired film thickness. If the result of this process is negative, then the preceding steps are repeated. If the result is positive, then an endpoint signal is sent by the analysis apparatus 5 to cause the polishing to end (Step S208), and the polishing system stops polishing with the signal.

As explained above, the film thickness of the active layer 6a can be measured while polishing takes place to more accurately achieve the desired film thickness of the active layer 6a.

In this example, film thickness measurement is performed during polishing using the window 12a in the plate 12. Even when no window is formed in the plate 12, it is possible to measure the film thickness of the active layer 6a by ensuring that the outer edges of the SOI substrate 6 extend beyond the outer perimeter of the plate 12 and by radiating light on this outer edge of the SOI substrate 6. In such an arrangement, when the outer edge of the SOI substrate 6 extends beyond the outer perimeter of the plate 12, the film thickness measurement step may take place as polishing continues or while the polishing is temporarily stopped.

Third Embodiment

A third embodiment relates to correction of an error in film thickness measurement of the active layer 6a.

Because the SOI substrate 6 in the first embodiment has a double-layer film structure, the active layer 6a is affected by the oxide film 6c below. As a result, the phase at the wavelengths corresponding to the peak values slightly shifts, when compared with that of a single layer film. This shift results in an error in the film thickness measurement such that the film seems thicker than it actually is. When a highly accurate film thickness measurement is required, this error may not fall within a tolerable range. This problem may be addressed by creating a table with a large number of actual measurement results for performing the correction. However, this approach is not very generic, and correction accuracy could be inconsistent, because the approach is not based on any theoretical principles. The thinner the active layer 6a and the thicker the oxide film 6c, the larger the errors would be.

To address this problem, this embodiment provides a means to correct for the error in film thickness of the active layer 6a, arising from the phase shifts s at the wavelengths corresponding to the selected peak values. An equation for the correction, shown as Equation N, corrects X in Equation C for phase shifts s at the wavelengths corresponding to the peak values. The symbol $s_1$ represents a phase shift amount that occurs between light reflecting from a single layer structure and light reflecting from a double layer structure at wavelength $\lambda_1$. The symbol $s_2$ represents the same at wavelength $\lambda_2$.

$$d = \frac{\lambda_1 \cdot \lambda_2}{\lambda_2 \cdot n(\lambda_1) - \lambda_1 \cdot n(\lambda_2)} \cdot \frac{(X + s_1 - s_2)}{2} \qquad \text{Equation N}$$

Before discussing the shift s, which is used for correcting the thickness measurement of the active layer 6a, the theory behind the spectrometry of the shift correction will be discussed. Refer to the discussion of the first embodiment for the part of spectrometry theory that applies to the first embodiment.

Firstly, in FIG. 6 of the first embodiment, medium II consists of a single layer film, and the optical energy reflectance R for the light traveling from medium II to medium I is obtained based on the optical interference phenomenon in this figure. Energy reflectance R can be represented by Equation I, which can be transformed into Equation O.

$$R = r \cdot \bar{r} = 1 - \frac{(1 - r_1^2) \cdot (1 - r_2^2)}{1 + r_1^2 \cdot r_2^2 + 2 \cdot r_1 \cdot r_2 \cdot \cos\delta} \qquad \text{Equation O}$$

Since $\delta = 4 \cdot \pi \cdot n_2 \cdot d/\lambda$ and $\cos\delta$ varies between $-1$ and $1$, the energy reflectance R reaches a maximum value or a minimum value when $\cos\delta = +/-1$. In other words, when $4 \cdot \pi \cdot n_2 \cdot d/\lambda = 2 \cdot m \cdot \pi$ and $4 \cdot \pi \cdot n_2 \cdot d/\lambda = (2 \cdot m - 1) \cdot \pi$, where m is a natural number, a maximum value or a minimum value is reached. As a result, two equations can be derived, which are $2 \cdot n \cdot d = m \cdot \lambda$ and $2 \cdot n \cdot d = (m - \frac{1}{2}) \cdot \lambda$. The relative sizes of the refractive indices $n_1$, $n_2$, and $n_3$ for each of the media I, II and III, respectively, or the $r_1$ and $r_2$ values derived from Equations D, E, F, and G based on the relative sizes of the refractive indices, would determine which of these two equations would correspond to the maximum values and which would correspond to the minimum values.

Figure 24:
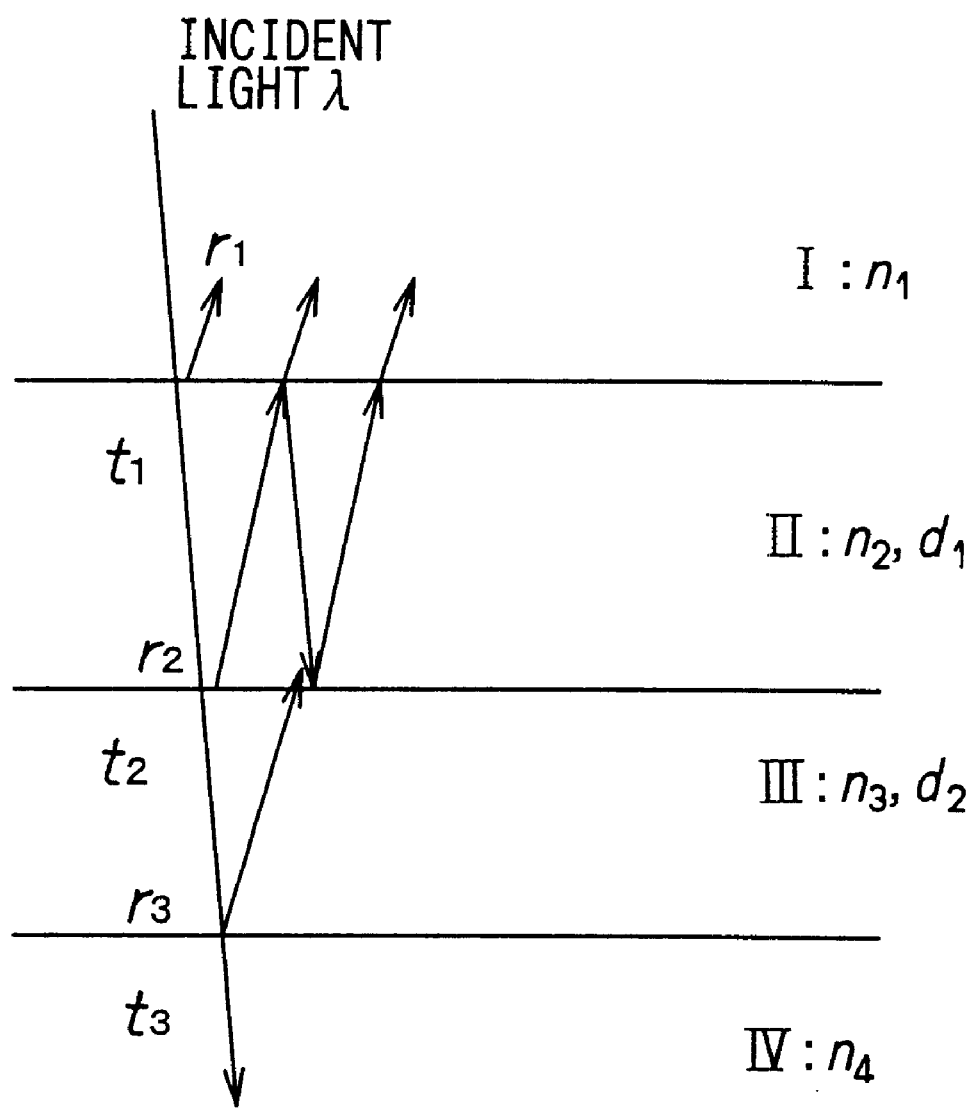
FIG. 24 is a diagram illustrating the optical interference phenomenon for a double layer structure.

FIG. 24 shows the optical interference phenomenon in a double layer film structure to illustrate the multiple reflections in a double layer structure. Like the single layer film structure, the energy reflectance R can be obtained using Equation P, when, as FIG. 24 shows for the medium I through medium IV, the refractive indices are $n_1$ to $n_4$, the film thickness of medium II is $d_1$, the film thickness of the medium III is $d_2$, the amplitude of the incoming light is one, the amplitudes of the reflective light are $r_1$ to $r_3$, and the amplitudes of the transmitted light are $t_1$ to $t_3$. However, $r'_2$ in Equation P is determined by Equation Q and corresponds to a compound reflectance for the amplifications of reflected light from medium III and medium IV. Also, $\delta_1 = 4\cdot\pi\cdot n_2\cdot d_1/\lambda$ and $\delta_2 = 4\cdot\pi\cdot n_3\cdot d_2/\lambda$.

$$R = r \cdot \bar{r} = \frac{r_1^2 + |r'_2|^2 + 2\cdot r_1 \cdot |r'_2|\cdot\cos\delta_1}{1 + r_1^2\cdot|r'_2|^2 + 2\cdot r_1\cdot|r'_2|\cdot\cos\delta_1} \quad \text{Equation P}$$

$$= 1 - \frac{(1-r_1^2)\cdot(1-|r'_2|^2)}{1 + r_1^2\cdot|r'_2|^2 + 2\cdot r_1\cdot|r'_2|\cdot\cos\delta_1}$$

$$r'_2 = \frac{r_2 + r_3 e^{-i\delta_2}}{1 + r_2 r_3 e^{-i\delta_2}} \quad \text{Equation Q}$$

Therefore, the reflectance at the lower interface of the single layer film structure is replaced by the compound reflectance $r'_2$ of the upper and lower interfaces of the medium III in Equation P and becomes equivalent to the reflectance for the model with the single layer film, if $r'_2$ remains constant as $\cos\delta$ modulates between −1 and 1. However, not only $\delta_1$, but $\delta_2$ also changes at the same time, making $r'_2$ change and causing a shift in the $\delta_1$ value at the maximum value or minimum value. Equation Q shows that the shift in $\delta_1$ is dependent on $\delta_2$, because $r'_2$ is dependent on $\delta_2$.

When the changes in $\delta_2$ are much smaller than the changes in $\delta_1$ with respect to the changes in the wavelength, Equation O can be replaced by the equation for a single layer film. However, when the relative sizes of changes in $\delta_1$ and $\delta_2$ are similar, a single layer film approximation no longer provides accurate film thickness $d_1$ for medium II. Specifically, the relative differences in the sizes of changes in $\delta_1$ and $\delta_2$ become small, when $\delta_1/\delta_2 = (n_2\cdot d_1)/(n_3\cdot d_2)$, or when the medium II film thickness is relatively small or the medium III film thickness is relatively large.

The discussion above shows that film thickness d of the active layer 6a cannot be accurately measured when the difference between changes in $\delta_1$ and $\delta_2$ is small. A correction is required to account for the shift in the film thickness d.

Therefore, when making a correction for the shift in the film thickness d, corresponding to $\delta_1$, for the active layer 6a in Equation C, it is necessary to estimate the shift corresponding to $\delta_1$ by obtaining the shift corresponding to $\delta_2$. The quantity $r'_2$ and the amount of phase shift s at the wavelength corresponding to the peak value for $\delta_1$ are dependent on $\cos\delta_2$. Also, $\delta_2/2\pi$ or the effect of $\delta_2$ is represented by the decimal part of the phase value ($2\cdot n\cdot d_{ox}/\lambda$) of the oxide film 6c, which is obtained from thickness of the oxide film 6c and the wavelength. By obtaining their relationship in advance, it is possible to determine the amount of phase shift s as a function of the decimal part of the phase value.

Figure 25:
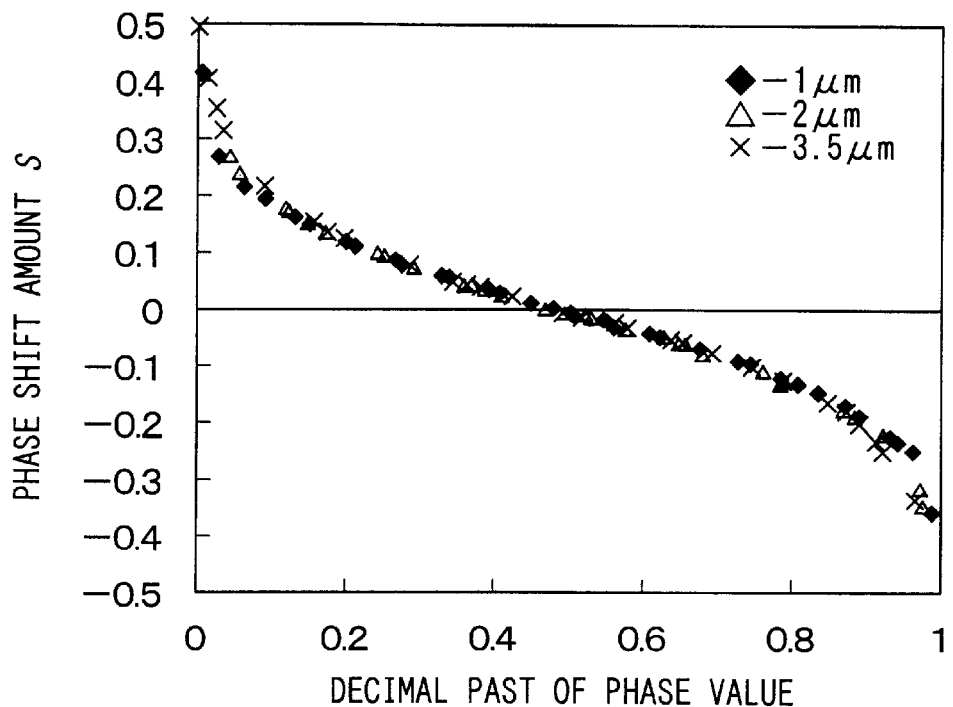
FIG. 25 is a graph obtained by simulation to show a relationship between the decimal part of a phase value and a phase shift amount s.

FIG. 25 shows a simulation result for the relationship between the amount of shift s and the decimal part of the phase value. This relationship makes it possible to obtain the phase shift s corresponding to the decimal part of the phase value.

Figure 26:
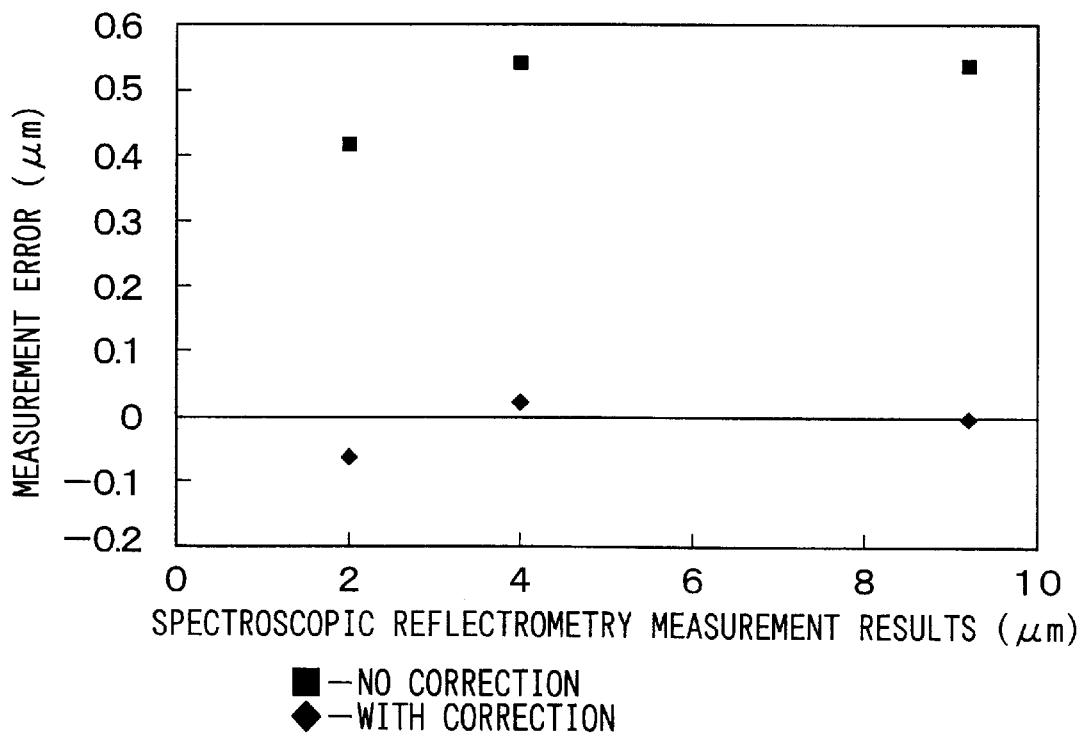
FIG. 26 is a graph showing measurement errors based on actual measurement results taken with the correction method of the third embodiment of this invention and measurements taken without correction.

As explained above, it is possible to accurately measure the film thickness of the active layer 6a by taking into account the amount of phase shift s and correcting the film thickness measurement on the active layer 6a. As a reference, FIG. 26 shows measurement errors by comparing results of measurements performed based on this invention with and without making the correction. In this experiment, the film thickness of the oxide film 6c is 3.57 μm. As this figure shows, a more accurate film thickness measurement of the active layer 6a is made possible by making the correction of this embodiment.

Other Embodiments

The principle of the method presented in the first embodiment is not the only principle of film thickness analysis that can be used in the embodiments discussed so far. It is possible to use other principles of film thickness analysis. For example, the method discussed below may be used. This method is explained using FIG. 4.

As FIG. 4 shows, when light is radiated on the SOI substrate 6, reflected light from the interface between the active layer 6a and the oxide film 6c interferes with light from the interface between the oxide film 6c and the supporting substrate 6b. This optical interference is dependent on the film thickness d and refractive index n of the active layer 6a and the wavelength λ.

When wavelength shifts from $\lambda_1$ to $\lambda_2$, the reflected beams either enhance each other or cancel each other. Supposing that the phase changes by ψ[rad], the thickness d of the active layer 6a may be expressed with the following equation.

$$d = \frac{\psi}{4\pi\left(\frac{n(\lambda_1)}{\lambda_1} - \frac{n(\lambda_2)}{\lambda_2}\right)} \quad \text{Equation R}$$

When ψ is a multiple of $2\pi$, Equation R becomes the same as Equation C for the film thickness analysis method described in the first embodiment. With the film thickness analysis method of the first embodiment, $\lambda_1$ and $\lambda_2$, at which λ varies in exact multiples, are obtained. However, it is also possible to calculate the film thickness d by choosing any values for $\lambda_1$ and $\lambda_2$ and observing changes in the wave form for the optical interference between $\lambda_1$ and $\lambda_2$. For example, a frequency analysis would make it possible to obtain film thickness d.

Specifically, when interference signals are plotted with wavelength along the x axis, the resulting wave form would show a slight periodicity around a center frequency. Therefore, ψ/2π in Equation R can be replaced by a center frequency f, the basic periodicity of which is $(\lambda_1 - \lambda_2)$, as shown in Equation S. In Equation S, the basic periodicity (f=1) for f is $(\lambda_1 - \lambda_2)$.

$$d = \frac{\lambda_1 \cdot \lambda_2}{2(n(\lambda_1)\cdot\lambda_1 - n(\lambda_2)\cdot\lambda_2)} \cdot f \quad \text{Equation S}$$

Therefore, the frequency f may be calculated by performing a Fourier conversion, and the film thickness d can be calculated based on this f value.

Furthermore, in the first embodiment, the range of analysis wavelengths was defined by entering the values known in advance (refractive index $n_{ox}$ and film thickness $d_{ox}$) into the analysis apparatus 5, so that they may be used for identifying the nodes.

It is also possible to define the range of analysis wavelengths by automatically detecting the maximum value from the wave form showing a relationship between the reflection intensity and wavelength, which are obtained from the interference data, drawing a curve by connecting the maximum values, and choosing the wavelength corresponding to the maximum value of this curve.

In the embodiment discussed earlier, the CCD array 4b is used as a means of collecting complete optical interference data. It is also possible to use a photo diode array.

It is also possible to remove the nodes without relying on the method in which complete interference data is obtained using, for example, a CCD array, in the embodiment discussed above. Such an alternative means will be just as effective in stripping out the nodes.

The third embodiment is related to a method of measuring film thickness of the active layer 6a on the SOI substrate 6. This method may also be employed for measuring (and correcting the measurement) the film thickness of a double layer film structure, the layers of which have different refractive indices.

While the invention has been described in detail with respect to specific embodiments, those skilled in the art, upon attaining an understanding of the specific embodiments, may readily conceive of alterations, variations, and equivalents to these embodiments. Accordingly, the scope of the invention should be assessed as that of the appended claims and their equivalents.

What is claimed is:

1. A method of measuring the film thickness of an active layer on an SOI substrate, wherein the SOI substrate includes the active layer, which is a semiconductor layer, and a supporting substrate, wherein the active layer and the supporting substrate sandwich an oxide film, the method comprising:

radiating light on the SOI substrate;

selecting a range of analysis wavelengths to eliminate wavelengths at which optical interference is weakened by light beams reflecting from both surfaces of the oxide film;

breaking down light that is reflected from the SOI substrate into a spectrum by wavelength;

collecting complete optical interference data by wavelength of the reflected light; and calculating the film thickness of the active layer based on the interference data in the selected wavelength range.

2. The method of claim 1 wherein the range of analysis wavelengths includes wavelengths X that satisfy the following inequality:

$$\frac{2 \cdot n_{ox}, d_{ox}}{m - 0.98} > \lambda > \frac{2 \cdot n_{ox} \cdot d_{ox}}{m - 0.02}$$

where $n_{ox}$ is an refractive index for the oxide film, $d_{ox}$ is the thickness of the oxide film, and m is an arbitrary positive integer.

3. The method of claim 2 including employment of a spectrometer that includes a diffraction grating for breaking the reflected light into a spectrum and a CCD array that collects the complete interference data on the spectrum.

4. The method of claim 2, wherein the method further includes:

determining a relationship between wavelength and intensity of reflection from the interference data; and determining wavelengths corresponding to a pair of peak values of a wave form showing the relationship are obtained, wherein peak values include both maximum values and minimum values, wherein the thickness of the active layer is calculated based on the determined wavelengths.

5. The method of claim 2, wherein the film thickness d of the active layer is calculated with the following equation:

$$d = \frac{\lambda_1 \cdot \lambda_2}{\lambda_2 \cdot n(\lambda_1) - \lambda_1 \cdot n(\lambda_2)} \cdot \frac{(X + s_1 - s_2)}{2}$$

where $\lambda_1$ and $\lambda_2$ are wavelengths corresponding to different peak values, respectively, $n(\lambda_1)$ is the film's refractive index at wavelength $\lambda_1$, $n(\lambda_2)$ is the film's refractive index at wavelength $\lambda_2$, X is the wave number between the two wavelengths, and $s_1$ and $s_2$ are phase shift amounts between a single layer film structure and a double layer film structure at the wavelengths corresponding to the peak values.

6. The method of claim 1, wherein the method further includes:

determining a relationship between wavelength and intensity of reflection from the interference data; and determining wavelengths corresponding to a pair of peak values of a wave form showing the relationship, wherein peak values include both maximum values and minimum values, and wherein the thickness of the active layer is calculated based on the determined wavelengths.

7. The method of claim 6, wherein the film thickness is calculated based on wavelengths corresponding to minimum values.

8. The method of claim 6, wherein the film thickness d of the active layer is calculated with the following equation:

$$d = \frac{\lambda_1 \cdot \lambda_2}{\lambda_2 \cdot n(\lambda_1) - \lambda_1 \cdot n(\lambda_2)} \cdot \frac{(X + s_1 - s_2)}{2}$$

where $\lambda_1$ and $\lambda_2$ are wavelengths corresponding to different peak values, respectively, $n(\lambda_1)$ is the film's refractive index at wavelength $\lambda_1$, $n(\lambda_2)$ is the film's refractive index at wavelength $\lambda_2$, X is the wave number between the two wavelengths, and $s_1$ and $s_2$ are phase shift amounts between a single layer film structure and a double layer film structure at the wavelengths corresponding to the peak values.

9. The method of claim 8, including the step of determining the phase shift amounts $s_1$ and $s_2$ based on the thickness of the oxide film and the wavelength of light passing through the oxide film.

10. The method of claim 1, wherein the range of analysis wavelengths is set so that the optical transmittance of the light of the selected range through the active layer is above a predetermined value.

11. The method of claim 10, wherein the predetermined value is 10%.

12. The method of claim 1 including employment of a spectrometer that includes a diffraction grating for breaking the reflected light into a spectrum and a CCD array that collects the complete interference data on the spectrum.

13. The method of claim 12 wherein, the upper limit of the range is selected to be less than approximately 1000 nm.

14. The method of claim 1 comprising:
polishing the active layer, wherein the measuring takes place during the polishing.

15. The method of claim 14 wherein the active layer is polished by rotating the SOI substrate in the polishing step and the film thickness measurement step is performed while the SOI substrate rotates.

16. The method of claim 1 comprising:
polishing the active layer, wherein the measuring takes place during the polishing;
comparing the measured thickness to a reference value; and
stopping polishing when it is determined that the thickness of the active layer has reached the reference value.

17. A method of measuring the film thickness of a semiconductor substrate that includes a first layer and a second layer, wherein the refractive index of the second layer is different from that of the first layer, and wherein the film thickness of the first layer is measured based on light reflected from the substrate, the method comprising:
radiating light onto the substrate;
breaking light reflected from the substrate into a spectrum by wavelength;
collecting complete optical interference data by wavelength of the reflected light; and
calculating the film thickness d of the first layer using the following equation:

$$d = \frac{\lambda_1 \cdot \lambda_2}{\lambda_2 \cdot n(\lambda_1) - \lambda_1 \cdot n(\lambda_2)} \cdot \frac{(X + s_1 - s_2)}{2}$$

where $\lambda_1$ and $\lambda_2$ are wavelengths corresponding to arbitrary peaks, wherein the peaks include maximum and minimum values, $n(\lambda_1)$ is the refractive index of the film at wavelength $\lambda_1$, $n(\lambda_2)$ is the refractive index of the film at wavelength $\lambda_2$, X is the wave number between the two wavelengths, and $s_1$ and $s_2$ are phase shift amounts at wavelengths corresponding to the peak values, respectively, between a single layer film structure and a double layer film structure.

18. The method of claim 17, including the step of determining the phase shift amounts $s_1$ and $s_2$ based on the thickness of the oxide film and the wavelength of light passing through the oxide film.

* * * * *